(12) United States Patent
Tachibana

(10) Patent No.: US 11,610,626 B2
(45) Date of Patent: Mar. 21, 2023

(54) ARITHMETIC DEVICE AND ARITHMETIC METHOD

(71) Applicant: Kioxia Corporation, Tokyo (JP)

(72) Inventor: Fumihiko Tachibana, Yokohama (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/353,044

(22) Filed: Jun. 21, 2021

(65) Prior Publication Data
US 2022/0093162 A1 Mar. 24, 2022

(30) Foreign Application Priority Data
Sep. 23, 2020 (JP) .............................. JP2020-158329

(51) Int. Cl.
| | | |
|---|---|---|
| *G11C 11/4094* | (2006.01) | |
| *G11C 11/4097* | (2006.01) | |
| *H03M 1/26* | (2006.01) | |
| *G11C 11/4074* | (2006.01) | |
| *G11C 5/06* | (2006.01) | |
| *G11C 11/408* | (2006.01) | |

(52) U.S. Cl.
CPC ............ *G11C 11/4094* (2013.01); *G11C 5/06* (2013.01); *G11C 11/4074* (2013.01); *G11C 11/4085* (2013.01); *G11C 11/4097* (2013.01); *H03M 1/26* (2013.01)

(58) Field of Classification Search
CPC .................. G11C 11/4097; G11C 5/06; G11C 11/4074; G11C 11/4085; H03M 1/26
USPC ..................................................... 365/185.13
See application file for complete search history.

(56) References Cited

U.S. PATENT DOCUMENTS

| | | | | |
|---|---|---|---|---|
| 2002/0036944 A1* | 3/2002 | Fujimoto | .................. | G11C 7/18 |
| | | | | 365/230.06 |
| 2012/0106281 A1* | 5/2012 | Kim | ......................... | G11C 7/18 |
| | | | | 365/207 |

(Continued)

FOREIGN PATENT DOCUMENTS

| | | |
|---|---|---|
| JP | 7-29384 A | 1/1995 |
| JP | 2019-79589 A | 5/2019 |
| JP | 2020-42873 A | 3/2020 |

OTHER PUBLICATIONS

Gonugondla et al., "A 42pJ/Decision 3.12TOPS/W Robust In-Memory Machine Learning Classifier with On-Chip Training" IEEE ISSCC, 2018, 3 pages.

(Continued)

*Primary Examiner* — Huan Hoang
(74) *Attorney, Agent, or Firm* — Oblon, McClelland, Maier & Neustadt, L.L.P.

(57) ABSTRACT

An arithmetic device includes a first memory cell, a first bit line, a first transistor, a second memory cell, a second bit line, a second transistor, a third bit line, a first switching circuit, a second switching circuit and a controller. The controller sets a conduction state between the first memory cell and the first bit line by the first transistor, and sets a conduction state between the second memory cell and the second bit line by the second transistor. The controller sets the first switching circuit and the second switching circuit in a coupled state and sets the conduction state between the first bit line and the third bit line and between the second bit line and the third bit line to transition voltages of the first, second and third bit lines to a first voltage.

20 Claims, 23 Drawing Sheets

(56) References Cited

U.S. PATENT DOCUMENTS

2016/0111138 A1   4/2016  Izumi et al.
2020/0082874 A1   3/2020  Dozaka
2020/0327924 A1*  10/2020 Cosemans ............. G11C 11/418

OTHER PUBLICATIONS

Zhang et al., "A 55nm 1-to-8 bit Configurable 6T SRAM based Computing-in-Memory Unit-Macro for CNN-based AI Edge Processors" IEEE ASSCC, 2019, 2 pages.

Miyano et al., "Highly Energy-Efficient SRAM With Hierarchical Bit Line Charge-Sharing Method Using Non-Selected Bit Line Charges" IEEE JSSC, Apr. 2013, 8 pages.

* cited by examiner

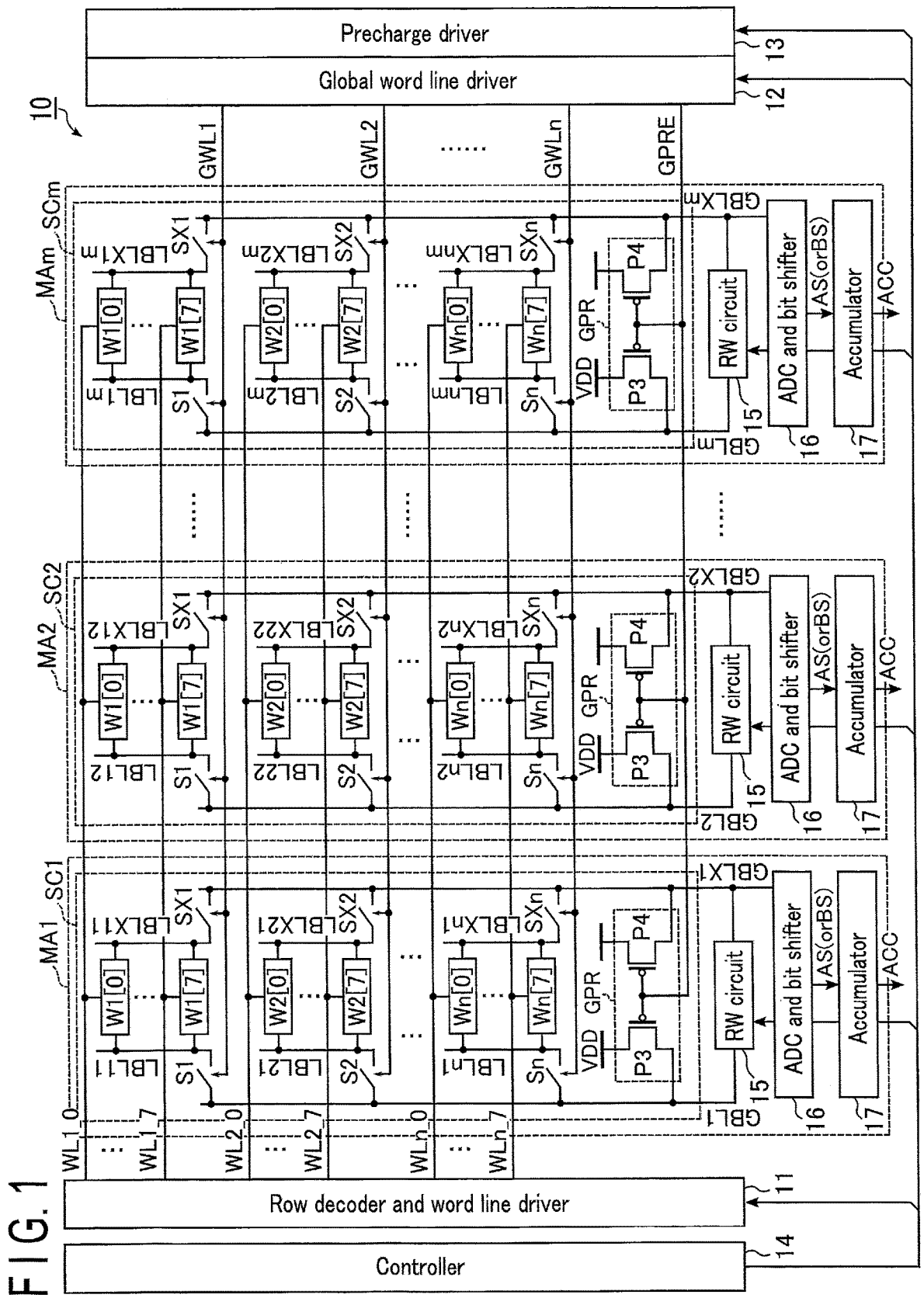
F I G. 1

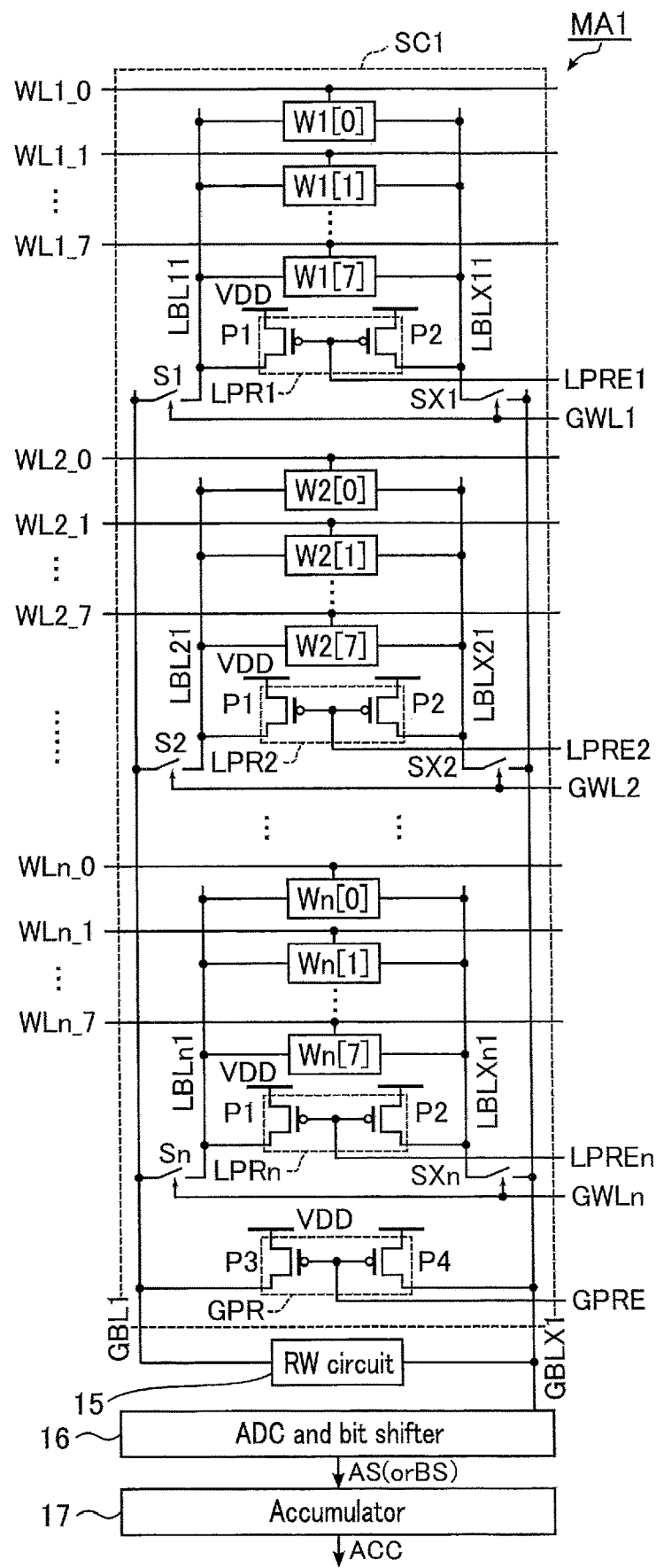
F I G. 2

When IN1=L, W1[0]=H or L

LPRE1

WL1_0    H  - - - - - - - - - - - - -
         L  _____

LBL11, LBLX11    H  _____
                 L  - - - - - - - - - - - - -

Voltage of LBLX11

|  | W1[0]=H | W1[0]=L |
|---|---|---|
| IN1=H | L | H |
| IN1=L | H | H |

Voltage of LBL11

|  | W1[0]=H | W1[0]=L |
|---|---|---|
| IN1=H | H | L |
| IN1=L | H | H |

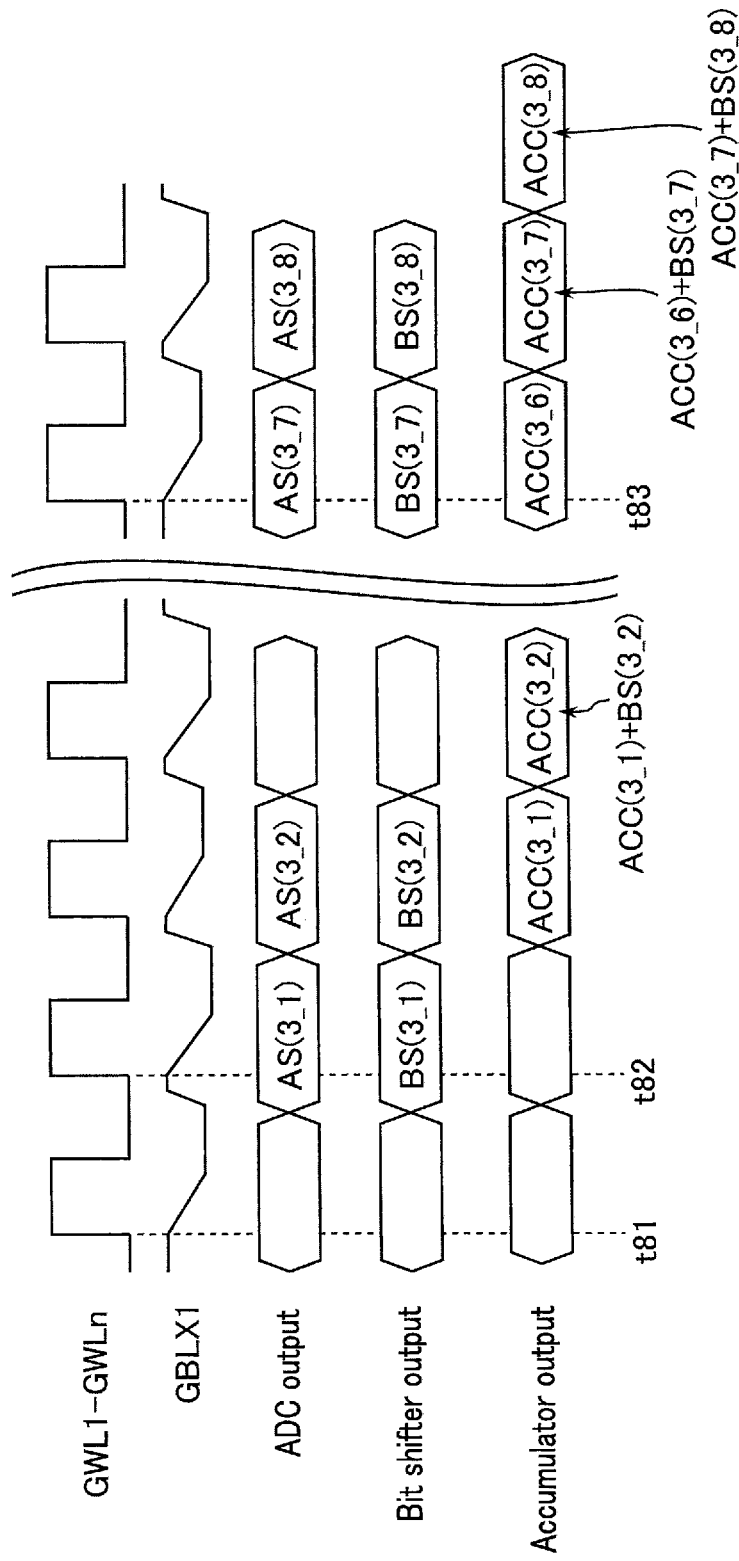
F I G. 25

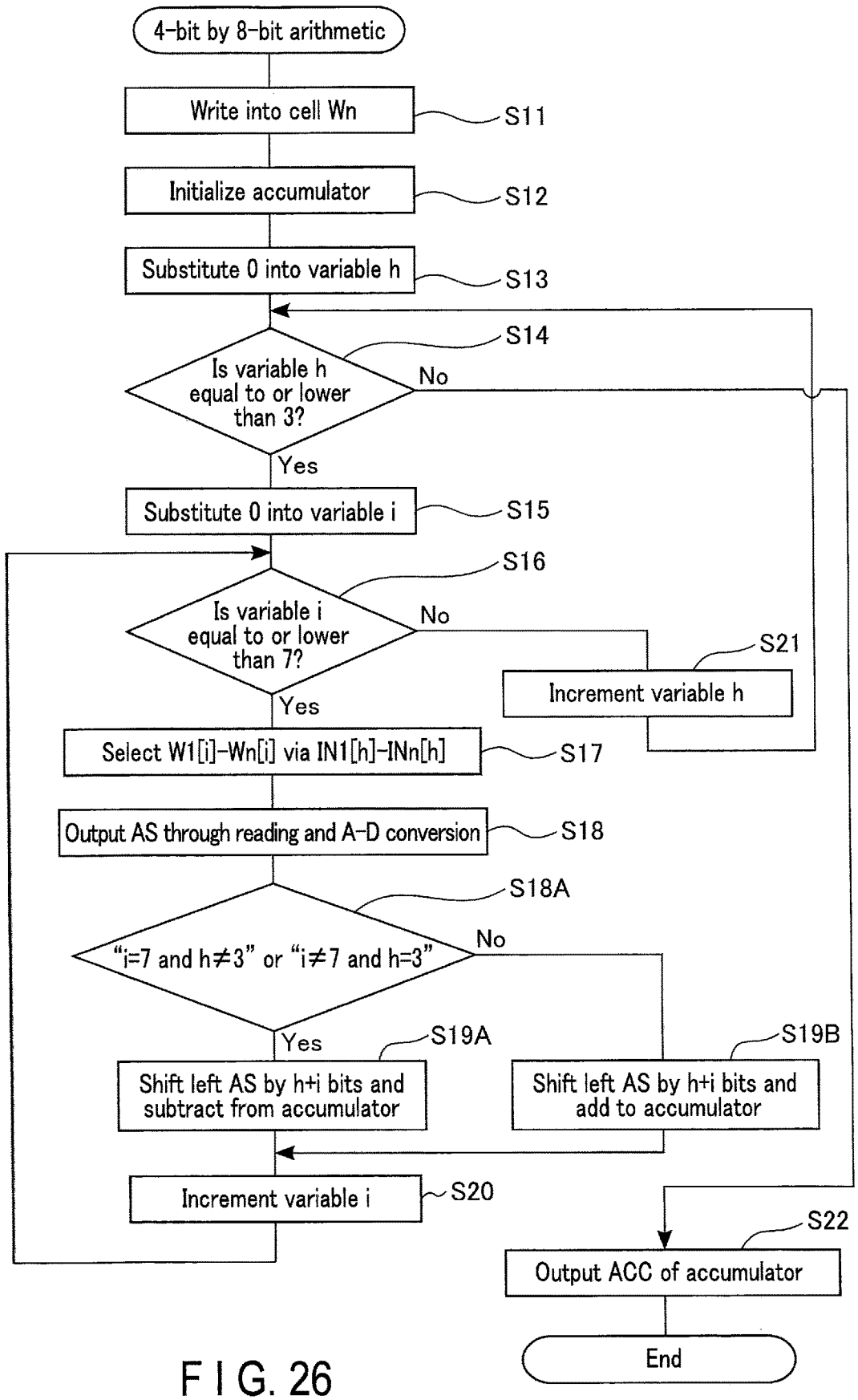
F I G. 26

ARITHMETIC DEVICE AND ARITHMETIC METHOD

CROSS-REFERENCE TO RELATED APPLICATIONS

This application is based upon and claims the benefit of priority from the Japanese Patent Application No. 2020-158329, filed Sep. 23, 2020, the entire contents of which are incorporated herein by reference.

FIELD

Embodiments described herein relate generally to an arithmetic device including a static random access memory (SRAM) and an arithmetic method.

BACKGROUND

An arithmetic device and an arithmetic method which use an SRAM are known.

BRIEF DESCRIPTION OF THE DRAWINGS

FIG. 1 is a circuit diagram showing a configuration of an arithmetic device according to an embodiment.

FIG. 2 is a circuit diagram showing a detailed configuration of a memory arithmetic circuit according to the embodiment.

FIG. 25 is a timing chart of the 4-bit by 8-bit multiply-accumulate operation according to the embodiment.

FIG. 26 is a flowchart in a case where the 4-bit by 8-bit multiply-accumulate operation is performed using 2's complement according to the embodiment.

DETAILED DESCRIPTION

Figure 3:
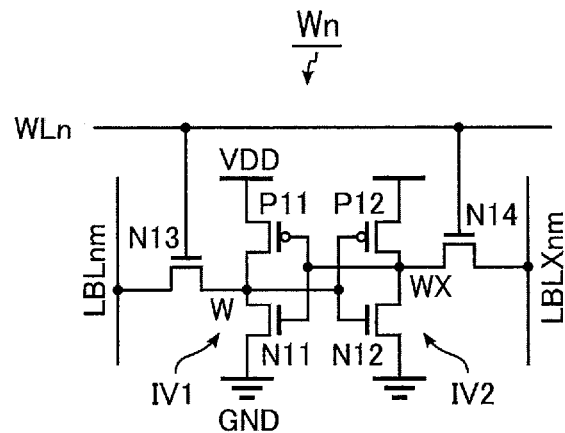
FIG. 3 is a circuit diagram showing a configuration of an SRAM cell according to the embodiment.

In general, according to one embodiment, an arithmetic device includes a first memory cell including a first inverter and a second inverter; a first bit line electrically coupled to the first memory cell; a first transistor electrically coupled between the first memory cell and the first bit line; a second memory cell including a third inverter and a fourth inverter; a second bit line electrically coupled to the second memory cell, the second bit line differing from the first bit line; a second transistor electrically coupled between the second memory cell and the second bit line; a third bit line which differs from both the first bit line and the second bit line; a first switching circuit electrically coupled between the first bit line and the third bit line, the first switching circuit being configured to switch between the first bit line and the third bit line to either a coupled state or a decoupled state; a second switching circuit electrically coupled between the second bit line and the third bit line, the second switching circuit being configured to switch between the second bit line and the third bit line to either a coupled state or a decoupled state; and a controller configured to control the first transistor, the second transistor, the first switching circuit, and the second switching circuit. The controller is configured to set a conduction state between the first memory cell and the first bit line by the first transistor; set a conduction state between the second memory cell and the second bit line by the second transistor; set the first switching circuit and the second switching circuit in a coupled state; and set the conduction state between the first bit line and the third bit line and between the second bit line and the third bit line to transition voltages of the first bit line, the second bit line, and the third bit line to a first voltage.

Hereinafter, embodiments will be described with reference to the accompanying drawings. In the description that follows, components having the same function and configuration will be assigned a common reference numeral. The embodiments to be described below are shown as an example of a device or a method for embodying the technical idea of the embodiments, and are not intended to limit the material, shape, structure, arrangement, etc. of components to those described below.

Each functional block can be implemented either in the form of hardware or computer software, or a combination thereof. The functional blocks are not necessarily separated as in the following example. For example, some of the functions may be executed by a functional block different from the functional block to be described as an example. In addition, the functional blocks to be described as an example may be divided into smaller functional subblocks.

1. Embodiment

Hereinafter, a description will be given of an arithmetic device and an arithmetic method according to an embodiment.

1.1 Configuration of Embodiment

1.1.1. Configuration of Arithmetic Device

FIG. 1 is a circuit diagram showing a configuration of the arithmetic device according to the embodiment. An arithmetic device 10 includes a plurality of memory arithmetic circuits MA1, MA2, ..., and MAm (where m is a natural number equal to or greater than 1), a row decoder and word line driver 11, a global word line driver 12, a precharge driver 13, and a controller 14. Hereinafter, when the plurality of memory arithmetic circuits MA1 to MAm are referred to, they are denoted as "memory arithmetic circuits MA".

The memory arithmetic circuit MAm includes a plurality of memory cells of static random access memories (hereinafter referred to as an "SRAM cells") W1[0], W1[1], W1[2], ..., and W1[7], SRAM cells W2[0], W2[1], W2[2], ..., and W2[7], and SRAM cells Wn[0], Wn[1], Wn[2], ..., and Wn[7] (where n is a natural number equal to or greater than 1). The memory arithmetic circuit MAm reads data stored in the SRAM cells W1[0] to W1[7], W2[0] to W2[7], ..., and Wn[0] to Wn[7], and performs a multiply-accumulate operation (or a product-sum operation) of the read data. Hereinafter, when each of the SRAM cells W1[0] to W1[7], W2[0] to W2[7], ..., and Wn[0] to Wn[7] is referred to, it is denoted as an "SRAM cell Wn".

The row decoder and word line driver 11 selects a word line coupled to an SRAM cell Wn to be a read target or a write target, and supplies a voltage to the selected word line. The global word line driver 12 controls coupling between a local bit line and a global bit line included in the memory arithmetic circuit MAm. The precharge driver 13 controls an operation of a precharge circuit included in the memory arithmetic circuit MAm. The controller 14 controls the memory arithmetic circuit MAm, the row decoder and word line driver 11, the global word line driver 12, and the precharge driver 13. Details of these components will be described later.

1.1.2. Configuration of Memory Arithmetic Circuit

Hereinafter, the configuration of the memory arithmetic circuits MA1 to MAm will be described with reference to FIGS. 1 and 2. FIG. 2 is a circuit diagram showing a detailed configuration of the memory arithmetic circuit MA1 shown in FIG. 1. The memory arithmetic circuit MA1 includes an SRAM cell group SC1, a read and write circuit (hereinafter referred to as an "RW circuit") 15, an analog-to-digital conversion circuit and bit shifter (hereinafter referred to as "ADC and bit shifter") 16, and an accumulator 17.

The SRAM cell group SC1 includes the above-described SRAM cells W1[0] to W1[7], W2[0] to W2[7], ..., Wn[0] to Wn[7], local precharge circuits LPR1, LPR2, ..., LPRn, and a global precharge circuit GPR.

Data stored in the SRAM cell Wn is weighted. Specifically, data in each of the SRAM cells W1[0], W2[0], ..., and Wn[0] is given a weight WE1. Data in each of the SRAM cells W1[1], W2[1], ..., and Wn[1] is given a weight WE2 different from the weight WE1. For example, the weight WE2 is double the weight WE1.

Similarly, data in each of the SRAM cells W1[2], W2[2], ..., and Wn[2] is given a weight WE3 different from the weights WE1 and WE2, even though such configurations are not shown. For example, the weight WE3 is double the weight WE2, and is $2^2$ times the weight WE1. Data in each of the SRAM cells W1[3], W2[3], ..., and Wn[3] is given a weight WE4 different from the weights WE1 to WE3. For example, the weight WE4 is double the weight WE3, and is 23 times the weight WE1.

Data in each of the SRAM cells W1[4], W2[4], ..., and Wn[4] is given a weight WE5 different from the weights WE1 to WE4. For example, the weight WE5 is double the weight WE4, and is $2^4$ times the weight WE1. Data in each of the SRAM cells W1[5], W2[5], ..., and Wn[5] is given a weight WE6 different from the weights WE1 to WE5. For example, the weight WE6 is double the weight WE5, and is $2^5$ times the weight WE1.

Data in each of the SRAM cells W1[6], W2[6], ..., and Wn[6] is given a weight WE7 different from the weights WE1 to WE6. For example, the weight WE7 is double the weight WE6, and is $2^6$ times the weight WE1. Data in each of the SRAM cells W1[7], W2[7], ..., and Wn[7] is given a weight WE8 different from the weights WE1 to WE7. For example, the weight WE8 is double the weight WE7, and is $2^7$ times the weight WE1.

The SRAM cells W1[0] to W1[7] are coupled in parallel between local bit lines LBL11 and LBLX11. The SRAM cells W2[0] to W2[7] are coupled in parallel between local bit lines LBL21 and LBLX21. Similarly, the SRAM cells Wn[0] to Wn[7] are coupled in parallel between local bit lines LBLn1 and LBLXn1.

A word line WL1_0 is coupled to the SRAM cell W1[0], and a word line WL1_1 is coupled to the SRAM cell W1[1]. A word line WL1_2 is coupled to the SRAM cell W1[2], and a word line WL1_3 is coupled to the SRAM cell W1[3], even though such a configuration is not illustrated.

A word line WL1_4 is coupled to the SRAM cell W1[4], and a word line WL1_5 is coupled to the SRAM cell W1[5]. A word line WL1_6 is coupled to the SRAM cell W1[6], and a word line WL1_7 is coupled to the SRAM cell W1[7].

Similarly, word lines WL2_0, WL2_1, ..., and WL2_7 are respectively coupled to the SRAM cells W2[0] to W2[7]. Word lines WLn_0, WLn_1, ..., and WLn_7 are respectively coupled to the SRAM cells Wn[0] to Wn[7]. Hereinafter, when each of the word lines WL1_0 to WL1_7, WL2_0 to WL2_7, and WLn_0 to WLn_7 is referred to, it is denoted as "word line WLn".

The word lines WL1_0 to WL1_7, WL2_0 to WL2_7, and WLn_0 to WLn_7 are coupled to the row decoder and word line driver 11. The row decoder and word line driver 11 selects and drives a word line WLn coupled to an SRAM cell Wn to be a read target or a write target.

The local precharge circuit LPR1 is coupled between the local bit lines LBL11 and LBLX11. The local precharge circuit LPR1 includes p-channel MOS field-effect transistors (hereinafter referred to as "pMOS transistors") P1 and P2. A drain of the pMOS transistor P1 is coupled to the local bit line LBL11, and a drain of the pMOS transistor P2 is coupled to the local bit line LBLX11. Sources of the pMOS transistors P1 and P2 are coupled to a power supply voltage terminal VDD. Gates of the pMOS transistors P1 and P2 are coupled to a precharge line LPRE1.

The precharge line LPRE1 is coupled to the precharge driver 13. The local precharge circuit LPR1 precharges the local bit lines LBL11 and LBLX11 to a high (H) voltage level (hereinafter referred to as "H") or stops the precharging to "H" in accordance with a signal level of the precharge line LPRE1 supplied from the precharge driver 13. The "H" is, for example, a voltage of the power supply voltage terminal VDD.

The local precharge circuit LPR2 is coupled between the local bit lines LBL21 and LBLX21. The local precharge circuit LPR2 includes pMOS transistors P1 and P2. A drain of the pMOS transistor P1 is coupled to the local bit line LBL21, and a drain of the pMOS transistor P2 is coupled to the local bit line LBLX21. Sources of the pMOS transistors P1 and P2 are coupled to the power supply voltage terminal VDD. Gates of the pMOS transistors P1 and P2 are coupled to a precharge line LPRE2.

The precharge line LPRE2 is coupled to the precharge driver 13. The local precharge circuit LPR2 precharges the local bit lines LBL21 and LBLX21 to "H" or stops the precharging to "H" in accordance with a signal level of the precharge line LPRE2 supplied from the precharge driver 13.

The local precharge circuit LPRn is coupled between the local bit lines LBLn1 and LBLXn1. The local precharge circuit LPRn includes pMOS transistors P1 and P2. A drain of the pMOS transistor P1 is coupled to the local bit line LBLn1, and a drain of the pMOS transistor P2 is coupled to the local bit line LBLXn1. Sources of the pMOS transistors P1 and P2 are coupled to the power supply voltage terminal VDD. Gates of the pMOS transistors P1 and P2 are coupled to a precharge line LPREn.

The precharge line LPREn is coupled to the precharge driver 13. The local precharge circuit LPRn precharges the local bit lines LBLn1 and LBLXn1 to "H" or stops the precharging to "H" in accordance with a signal level of the precharge line LPREn supplied from the precharge driver 13.

The local bit line LBL11 is coupled to a global bit line GBL1 via a switching circuit S1. The local bit line LBLX11 is coupled to a global bit line GBLX1 via a switching circuit SX1. The local bit line LBL21 is coupled to the global bit line GBL1 via a switching circuit S2. The local bit line LBLX21 is coupled to the global bit line GBLX1 via a switching circuit SX2. Similarly, the local bit line LBLn1 is coupled to the global bit line GBL1 via a switching circuit Sn. The local bit line LBLXn1 is coupled to the global bit line GBLX1 via a switching circuit SXn.

Control terminals of the switching circuits S1 and SX1 are coupled to a global word line GWL1. The global word line GWL1 is coupled to the global word line driver 12. The switching circuit S1 sets the local bit line LBL11 and the global bit line GBL1 to be coupled to each other or decoupled from each other in accordance with a signal level of the global word line GWL1 supplied from the global word line driver 12. The switching circuit SX1 sets the local bit line LBLX11 and the global bit line GBLX1 to be coupled to each other or decoupled from each other in accordance with a signal level of the global word line GWL1 supplied from the global word line driver 12.

Control terminals of the switching circuits S2 and SX2 are coupled to a global word line GWL2. The global word line GWL2 is coupled to the global word line driver 12. The switching circuit S2 sets the local bit line LBL21 and the global bit line GBL1 to be coupled to each other or decoupled from each other in accordance with a signal level of the global word line GWL2 supplied from the global word line driver 12. The switching circuit SX2 sets the local bit line LBLX21 and the global bit line GBLX1 to be coupled to each other or decoupled from each other in accordance with a signal level of the global word line GWL2 supplied from the global word line driver 12.

Similarly, control terminals of the switching circuits Sn and SXn are coupled to a global word line GWLn. The global word line GWLn is coupled to the global word line driver 12. The switching circuit Sn sets the local bit line LBLn1 and the global bit line GBL1 to be coupled to each other or decoupled from each other in accordance with a signal level of the global word line GWLn supplied from the global word line driver 12. The switching circuit SXn sets the local bit line LBLXn1 and the global bit line GBLX1 to be coupled to each other or decoupled from each other in accordance with a signal level of the global word line GWLn supplied from the global word line driver 12.

The global precharge circuit GPR is coupled between the global bit lines GBL1 and GBLX1. The global precharge circuit GPR includes pMOS transistors P3 and P4. A drain of the pMOS transistor P3 is coupled to the global bit line GBL1, and a drain of the pMOS transistor P4 is coupled to the global bit line GBLX1. Sources of the pMOS transistors P3 and P4 are coupled to the power supply voltage terminal VDD. Gates of the pMOS transistors P3 and P4 are coupled to a precharge line GPRE.

The precharge line GPRE is coupled to the precharge driver 13. The global precharge circuit GPR precharges the global bit lines GBL1 and GBLX1 to "H" or stops the precharging to "H" in accordance with a signal level of the precharge line GPRE supplied from the precharge driver 13.

The global bit lines GBL1 and GBLX1 are coupled to the RW circuit 15. The RW circuit 15 writes data into the SRAM cell Wn using the global bit lines GBL1 and GBLX1. Also, the RW circuit 15 reads data from the SRAM cell Wn using the global bit line GBLX1.

The global bit line GBLX1 is coupled to the ADC and bit shifter 16. The ADC and bit shifter 16 converts a voltage level of the global bit line GBLX1 into a digital value, and outputs the digital value as a signal AS. When the read SRAM cell Wn is assigned weights WE2 to WE8, the ADC and bit shifter 16 converts a voltage level of the global bit line GBLX1 into a digital value, and uses the digital value as the signal AS. The signal AS is subjected to a bit shift (e.g., a left shift) according to the weights WE2 to WE8 assigned to the SRAM cell Wn, and is output as a signal BS. When the read SRAM cell Wn is assigned a weight WE2, the voltage level of the global bit line GBLX1 is subjected to analog-to-digital conversion, and thereby the signal AS is obtained. Furthermore, the signal AS is subjected to a left shift by the number of bits according to the weight WE2, and is output as the signal BS.

Output terminals of the ADC and bit shifter 16 are coupled to the accumulator 17. The accumulator 17 accumulates (or integrates) the signal AS or the signal BS output from the ADC and bit shifter 16, and outputs an accumulated signal ACC.

Hereinafter, a configuration of the memory arithmetic circuit MA2 will be described. The configuration of the memory arithmetic circuit MA2 is similar to the memory arithmetic circuit MA1, but are different from the memory arithmetic circuit MA1 in terms of a SRAM cell group SC2, local bit lines LBL12 to LBLn2 and LBLX12 to LBLXn2, and global bit lines GBL2 and GBLX2.

Hereinafter, a configuration of the memory arithmetic circuit MAm will be described. The configuration of the memory arithmetic circuit MAm is similar to the memory arithmetic circuit MA1, but are different from the memory arithmetic circuit MA1 in terms of a SRAM cell group SCm, local bit lines LBL1$m$ to LBLnm and LBLX1$m$ to LBLXnm, and global bit lines GBLm and GBLXm.

In the above-described configuration, an example has been described in which eight SRAM cells Wn[0] to Wn[7] are coupled between the local bit lines LBLnm and LBLXnm; however, the number of the SRAM cells Wn coupled between the local bit lines LBLnm and LBLXnm may be freely set, and may be, for example, 16 or 32.

1.1.3 Configuration of SRAM Cell

Next, a circuit configuration of the SRAM cell Wn included in the memory arithmetic circuit MAm will be described with reference to FIG. 3. FIG. 3 is a circuit diagram showing a configuration of the SRAM cell Wn.

The SRAM cell Wn includes a first inverter IV1 including a pMOS transistor P11 and an n-channel MOS field-effect transistor (hereinafter referred to as "nMOS transistor") N11, a second inverter IV2 including a pMOS transistor P12 and an nMOS transistor N12, and nMOS transistors N13 and N14. The SRAM cell Wn causes the inverters IV1 and IV2 to store "H" and a low (L) voltage level (hereinafter referred to as "L") or "L" and "H" data, respectively, in the nodes W and WX. The "L" is, for example, a voltage of a reference voltage terminal (e.g., a ground potential node) GND.

Output terminals and input terminals of the inverter IV1 and the inverter IV2 are cross-coupled to one another. That is, the output terminal of the inverter IV1 is coupled to the input terminal of the inverter IV2, and the input terminal of the inverter IV1 is coupled to the output terminal of the inverter IV2. Sources of the pMOS transistors P11 and P12 are coupled to the power supply voltage terminal VDD, and sources of the nMOS transistors N11 and N12 are coupled to the reference voltage terminal GND.

The output terminal of the inverter IV1, namely, a drain of the pMOS transistor P11 and a drain of the nMOS transistor N11 are coupled to a source (or a drain) of the nMOS transistor N13. The drain (or the source) of the nMOS transistor N13 is coupled to a local bit line LBLnm. The output terminal of the inverter IV2, namely, a drain of the pMOS transistor P12 and a drain of the nMOS transistor N12 are coupled to a source (or a drain) of the nMOS transistor N14. The drain (or the source) of the nMOS transistor N14 is coupled to a local bit line LBLXnm.

A word line WLn is coupled to gates of the nMOS transistors N13 and N14. The nMOS transistors N13 and N14 are switched to an on state or an off state according to the voltage of the word line WLn, and function as transfer transistors.

1.2 Operation According to Embodiment

Hereinafter, an operation of the arithmetic device 10 according to the embodiment will be described.

1.2.1 Basic Operation of SRAM Cell Wn

Figure 4:
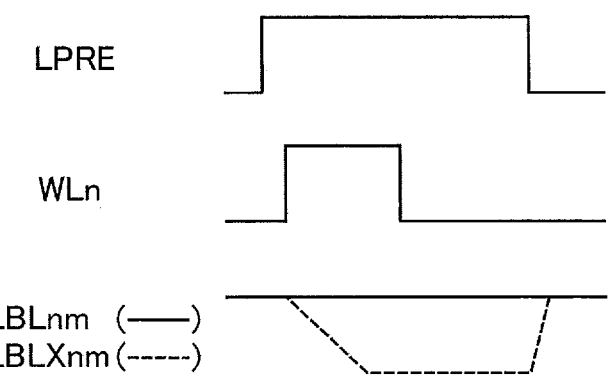
FIGS. 4 and 5 are timing charts showing a basic read operation of the SRAM cell.
Figure 5:
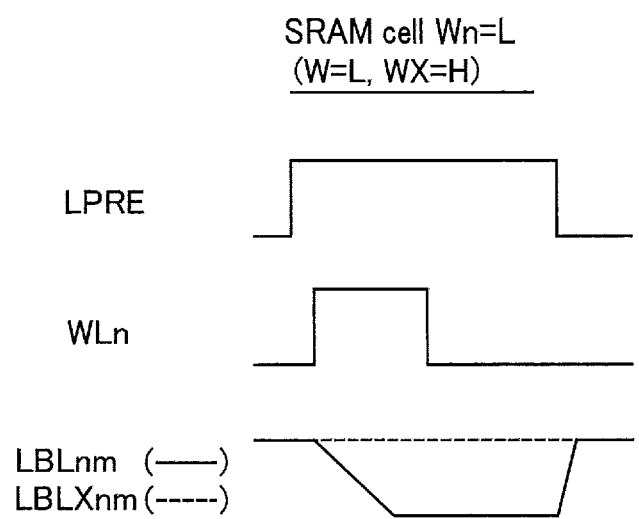

First, a basic read operation of the SRAM cell Wn will be described with reference to FIGS. 4 and 5. FIGS. 4 and 5 are timing charts showing the basic read operation of the SRAM cell Wn. It is assume that, when the SRAM cell Wn stores "H" (e.g., "1")), a node W retains "H", and a node WX retains "L". In this case, the operation is as follows.

As shown in FIG. 4, the precharge driver 13 sets the precharge line LPRE from "L" to "H". Thereby, the precharging of the local bit lines LBLnm and LBLXnm to "H" is stopped.

Thereafter, the row decoder and word line driver 11 sets the word line WLn to "H". This causes the nMOS transistors N13 and N14 to transition to the on state.

Here, since the node W retains "H" and the node WX retains "L" in the SRAM cell Wn, the charge of the local bit line LBLXnm is discharged through the nMOS transistors N14 and N12. This causes the voltage of the local bit line LBLXnm to transition from "H" to "L". On the other hand, the voltage of the local bit line LBLnm is maintained at "H".

It is also assume that, when the SRAM cell Wn stores "L" (e.g., "0"), the node W retains "L", and the node WX retains "H". In this case, the operation is as follows.

As shown in FIG. 5, the precharge driver 13 sets the local precharge line LPRE from "L" to "H". Thereby, the precharging of the local bit lines LBLnm and LBLXnm to "H" is stopped.

Thereafter, the row decoder and word line driver 11 sets the word line WLn to "H". This causes the nMOS transistors N13 and N14 to transition to the on state.

Here, since the node W retains "L" and the node WX retains "H" in the SRAM cell Wn, the voltage of the local bit line LBLXnm is maintained at "H". On the other hand, the charge of the local bit line LBLnm is discharged through the nMOS transistors N13 and N11. This causes the voltage of the local bit line LBLnm to transition from "H" to "L".

1.2.2 Read Operation of SRAM Cell Wn

Next, a read operation of the SRAM cell Wn in the arithmetic device 10 will be described. Here, it is assume that the read target is the SRAM cell W1[0]. The SRAM cell W1[0] is coupled between the local bit lines LBL11 and LBLX11, and the word line WL1_0 is coupled between gates of the nMOS transistors N13 and N14 of the SRAM cell W1[0].

Figure 6:
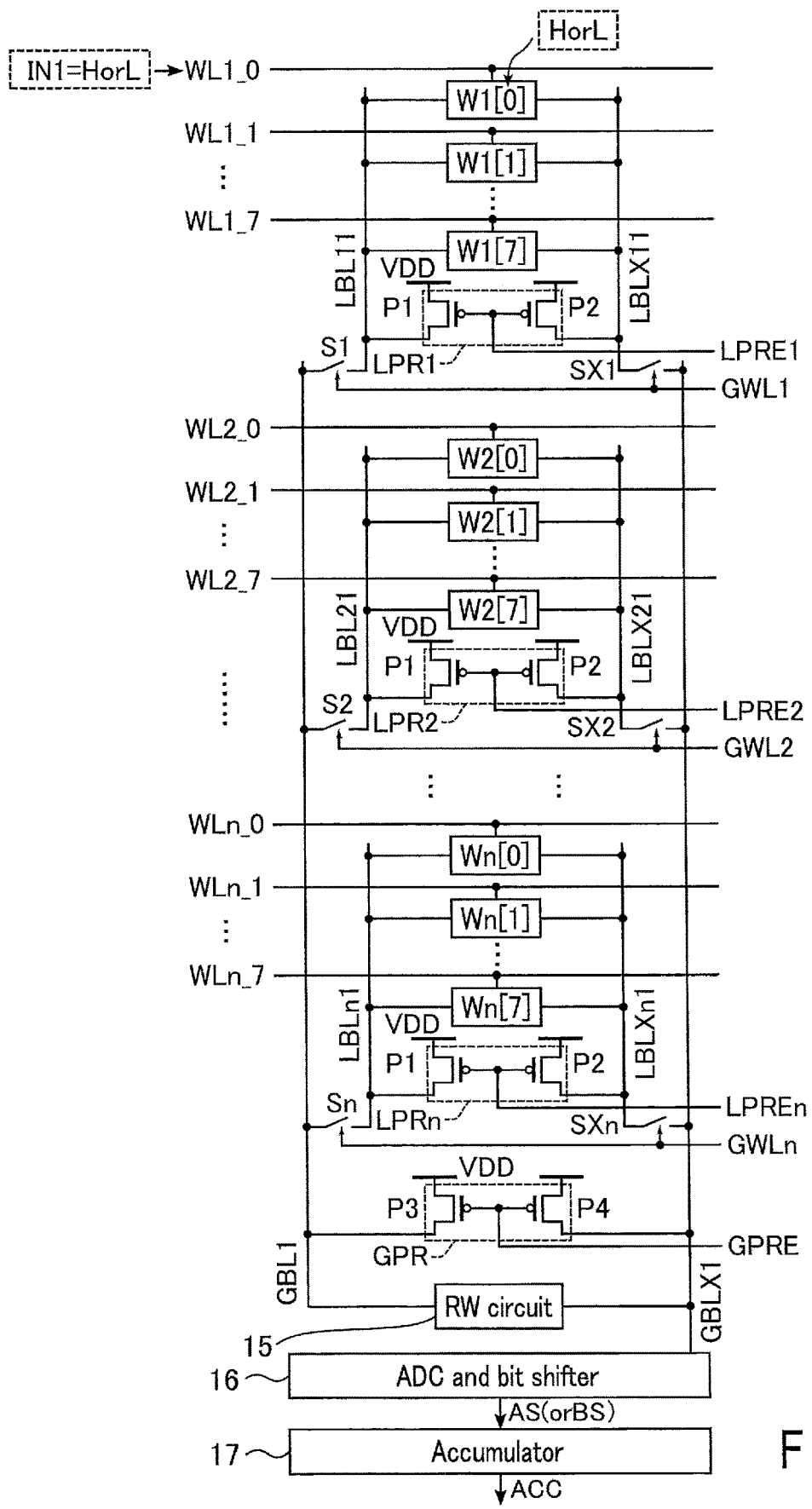
FIG. 6 is a circuit diagram for explaining a read operation of the SRAM cell in the arithmetic device according to the embodiment.
Figure 7:
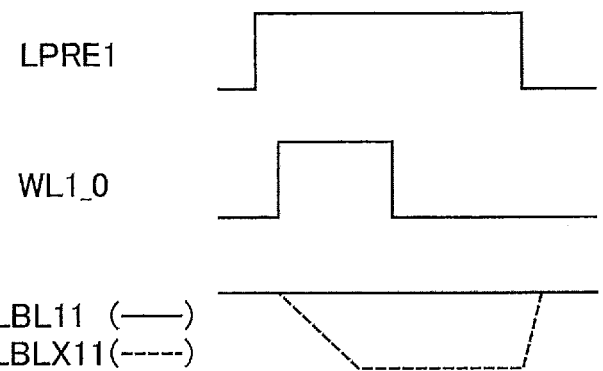
FIGS. 7, 8 and 9 are timing charts showing the read operation of the SRAM cell according to the embodiment.
Figure 8:
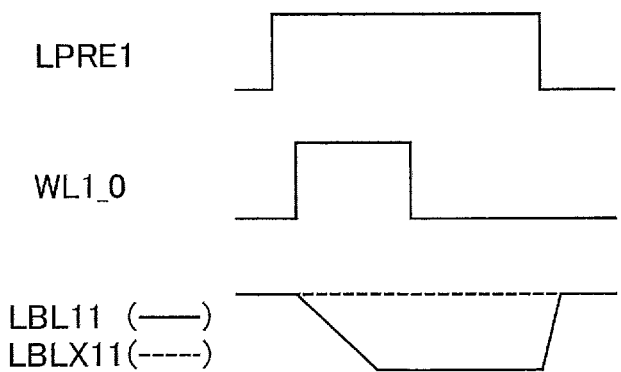
Figures 9, 10:
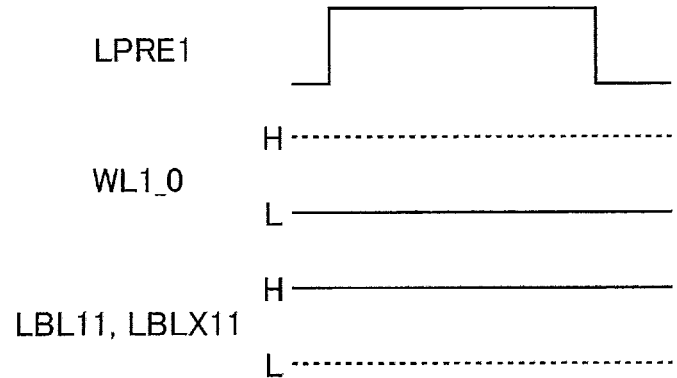
FIG. 10 is a diagram showing a correspondence of signals in the read operation of the SRAM cell according to the embodiment.

FIG. 6 is a circuit diagram for explaining a read operation of the SRAM cell W1[0] in the arithmetic device 10. FIGS. 7, 8 and 9 are timing charts showing the read operation of the SRAM cell W1[0]. The input signal IN1 corresponds to the word line WL1_0, and when the input signal IN1 is "H", the word line WL1_0 is set to "H", and when the input signal IN1 is "L", the word line WL1_0 is set to "L".

(1) When Input Signal IN1 is "H"

When the SRAM cell W1[0] stores "H", the node W retains "H", and the node WX retains "L", for example. In this case, a read operation of the SRAM cell W1[0] is as follows.

As shown in FIG. 7, the precharge driver 13 sets the precharge line LPRE1 from "L" to "H". Thereby, the precharging of the local bit lines LBL11 and LBLX11 to "H" is stopped.

Thereafter, the row decoder and word line driver 11 sets the word line WL1_0 to "H". Thereby, the nMOS transistors N13 and N14 are switched to the on state, and the SRAM cell W1[0] and the local bit line LBL11, and the SRAM cell W1[0] and the local bit line LBLX11 are respectively brought into conduction.

Here, since the node W retains "H" and the node WX retains "L", the charge of the local bit line LBLX11 is discharged. This causes the voltage of the local bit line LBLX11 to transition from "H" to "L". On the other hand, the voltage of the local bit line LBL11 is maintained at "H".

On the other hand, when the SRAM cell W1[0] stores "L", the node W retains "L", and the node WX retains "H", for example. In this case, a read operation of the SRAM cell W1[0] is as follows.

As shown in FIG. 8, the precharge driver 13 sets the precharge line LPRE1 from "L" to "H". Thereby, the charging of the local bit lines LBL11 and LBLX11 to "H" is stopped.

Thereafter, the row decoder and word line driver 11 sets the word line WL1_0 to "H". Thereby, the nMOS transistors N13 and N14 are switched to the on state, and the SRAM cell W1[0] and the local bit line LBL11, and the SRAM cell W1[0] and the local bit line LBLX11 are respectively brought into conduction.

Here, since the node W retains "L" and the node WX retains "H", the voltage of the local bit line LBLX11 is maintained at "H". On the other hand, the charge of the local bit line LBL11 is discharged. This causes the voltage of the local bit line LBL11 to transition from "H" to "L".

(2) When Input Signal IN1 is "L"

When the input signal IN1 is "L", no matter whether "H" or "L" is stored in the SRAM cell W1[0], a read operation of the SRAM cell W1[0] is as follows.

As shown in FIG. 9, the precharge driver 13 sets the precharge line LPRE1 from "L" to "H". Thereby, the precharging of the local bit lines LBL11 and LBLX11 to "H" is stopped.

Thereafter, the row decoder and word line driver 11 maintains the word line WL1_0 at "L". Thereby, the nMOS transistors N13 and N14 are maintained in the off state, and the SRAM cell W1[0] and the local bit line LBL11, and the SRAM cell W1[0] and the local bit line LBLX11 are respectively kept interrupted (or non-conducted) from each other. Thus, the voltages of the local bit lines LBL11 and LBLX11 are maintained at "H".

FIG. 10 is a diagram showing a correspondence of the signals in the above-described read operation of the SRAM cell W1[0]. The voltage of the local bit line LBLX11 becomes "L" when the input signal IN1 is "H" and the SRAM cell W1[0] is "H", and becomes "H" when the input signal IN1 is "H" and the SRAM cell W1[0] is "L". The voltage of the local bit line LBLX11 becomes "H" when the input signal IN1 is "L", no matter whether the SRAM cell W1[0] is "H" or "L".

The voltage of the local bit line LBL11 becomes "H" when the input signal IN1 is "H" and the SRAM cell W1[0] is "H", and becomes "L" when the input signal IN1 is "H" and the SRAM cell W1[0] is "L". The voltage of the local bit line LBL11 becomes "H" when the input signal IN1 is "L", no matter whether the SRAM cell W1[0] is "H" or "L".

When the SRAM cell W1[0] stores "H", a case has been described where the node W retains "H" and the node WX retains "L"; however, the node W may retain "L" and the node WX may retain "H". In this case, when the SRAM cell W1[0] stores "L", the node W retains "H", and the node WX retains "L". Also, in this case, the voltages read to the local bit lines LBLX11 and LBL11 become opposite.

In the foregoing, the read operation of the SRAM cell W1[0] coupled to the local bit lines LBL11 and LBLX11 and the word line WL1_0 have been described; however, the same applies to read operations of the SRAM cells Wn[0] to Wn[7] respectively coupled to the other local bit lines LBLnm and LBLXnm and the word lines WLn_0 to WLn_7.

1.2.3 Multiply-Accumulate Operation (1) of SRAM Cell Wn

Next, a multiply-accumulate operation of the SRAM cell Wn in the arithmetic device 10 will be described below as first to third examples.

Figure 11:
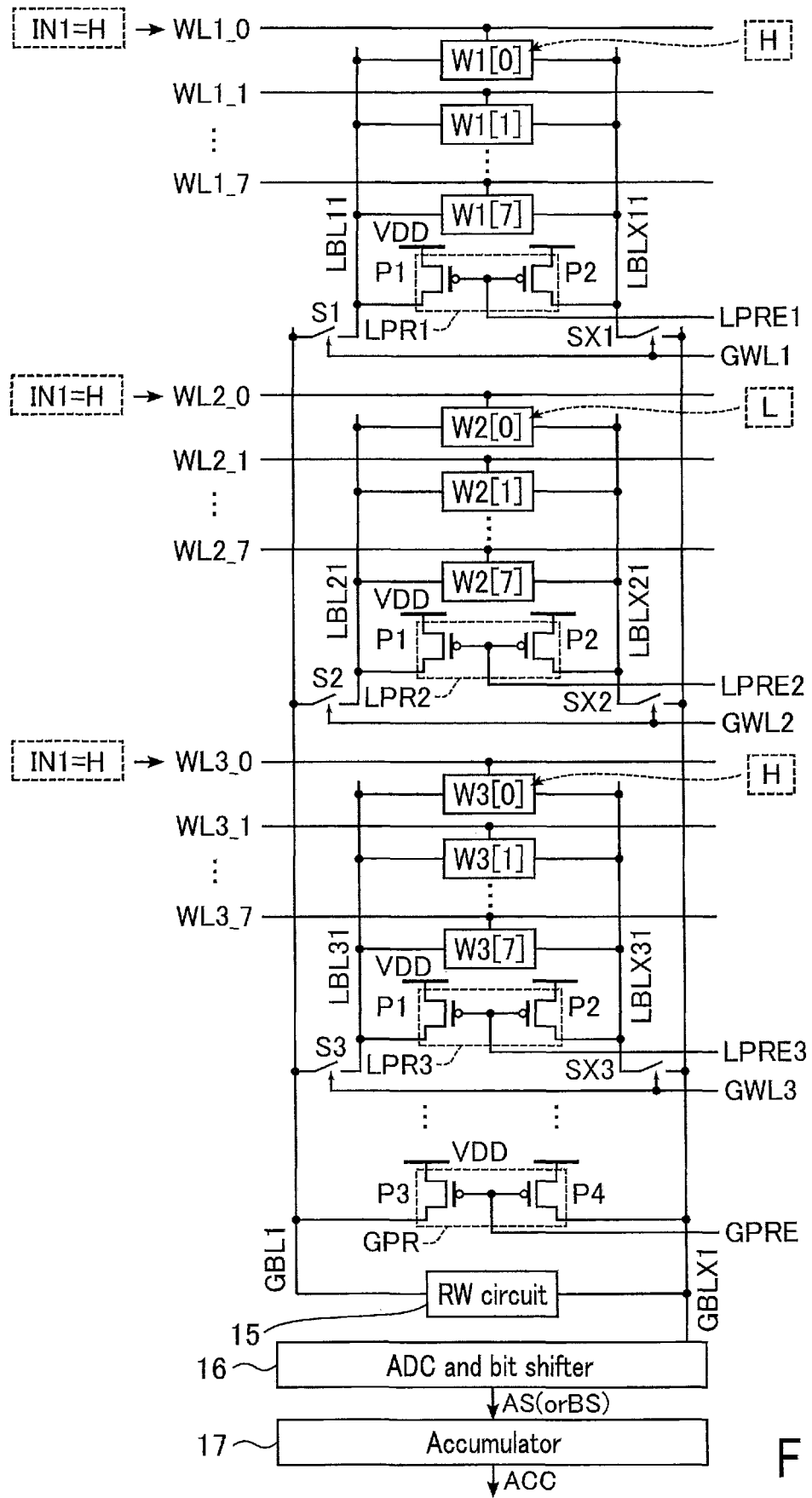
FIG. 11 is a circuit diagram illustrating a first example of a multiply-accumulate operation of an SRAM cell according to the embodiment.
Figure 12:
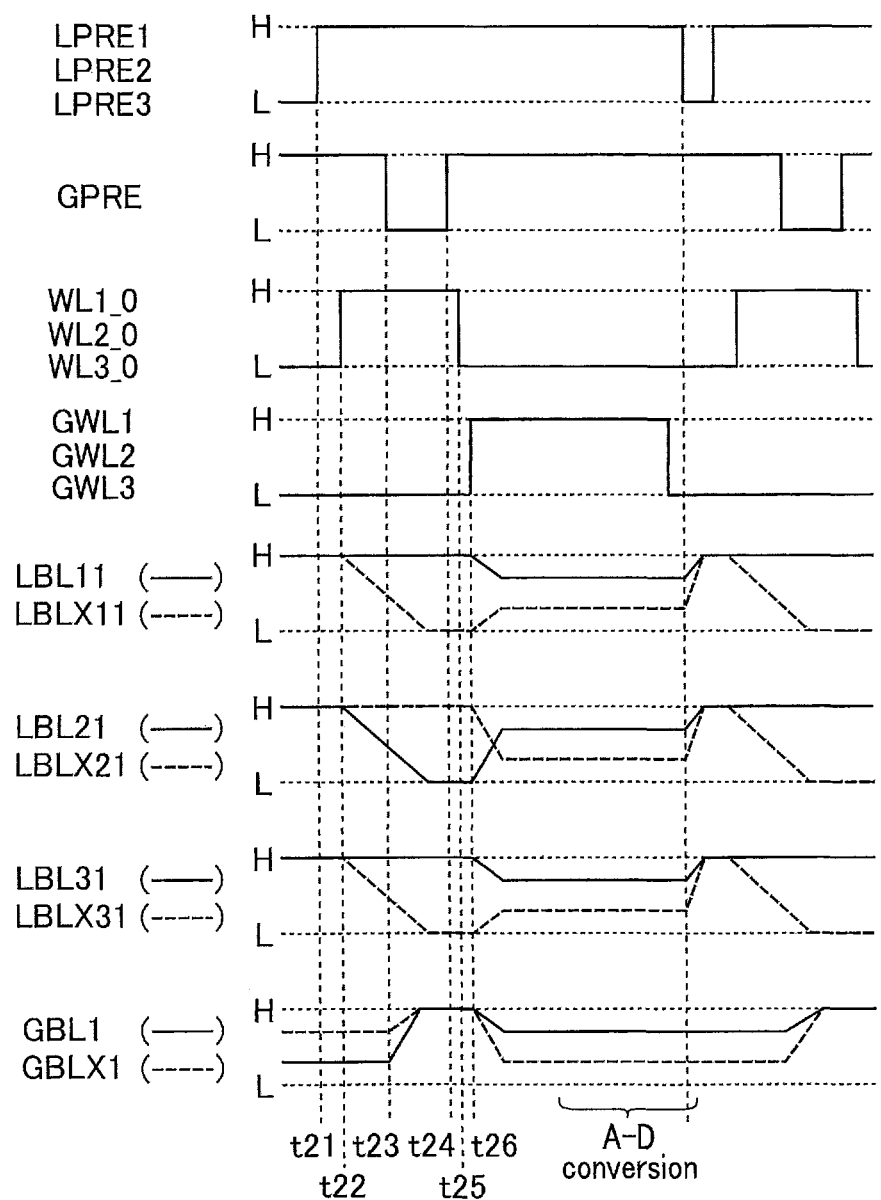
FIG. 12 is a timing chart showing the first example of the multiply-accumulate operation of the SRAM cell according to the embodiment.

First, a multiply-accumulate operation performed by three SRAM cells W1[0], W2[0], and W3[0] will be described as a first example. FIG. 11 is a circuit diagram illustrating the multiply-accumulate operation of the SRAM cells W1[0], W2[0], and W3[0] according to the first example. FIG. 12 is a timing chart showing the multiply-accumulate operation of the SRAM cells W1[0], W2[0], and W3[0] according to the first example. This arithmetic operation shows a case where there are two combinations in which the input signal IN1 is "H" and the SRAM cell Wn is "H". Examples include a case where the word lines WL1_0, WL2_0, and WL3_0 are set to "H", the SRAM cells W1[0] and W3[0] store "H", and the SRAM cell W2[0] stores "L".

As shown in FIG. 12, the precharge driver 13 sets the precharge lines LPRE1, LPRE2, and LPRE3 from "L" to "H" at time t21. Thereby, the precharging of the local bit lines LBL11, LBL21, LBL31, LBLX11, LBLX21, and LBLX31 to "H" is stopped.

Thereafter, at time t22, the row decoder and word line driver 11 sets the word lines WL1_0, WL2_0, and WL3_0 to "H". Thereby, the nMOS transistors N13 and N14 of the SRAM cells W1[0] to W3[0] are switched to the on state, and the SRAM cell W1[0] and the local bit line LBL11, and the SRAM cell W1[0] and the local bit line LBLX11 are respectively brought into conduction. Similarly, the SRAM cell W2[0] and the local bit line LBL21, the SRAM cell W2[0] and the local bit line LBLX21, the SRAM cell W3[0] and the local bit line LBL31, and the SRAM cell W3[0] and the local bit line LBLX31 are respectively brought into conduction.

Here, since the node W retains "H" and the node WX retains "L" in the SRAM cell W1[0], the charge of the local bit line LBLX11 is discharged. This causes the voltage of the local bit line LBLX11 to transition from "H" to "L". On the other hand, the voltage of the local bit line LBL11 is maintained at "H".

Since the node W retains "L" and the node WX retains "H" in the SRAM cell W2[0], the voltage of the local bit line LBLX21 is maintained at "H". On the other hand, the charge of the local bit line LBL21 is discharged, and the voltage of the local bit line LBL21 transitions from "H" to "L".

Since the node W retains "H" and the node WX retains "L" in the SRAM cell W3[0], the charge of the local bit line LBLX31 is discharged. This causes the voltage of the local bit line LBLX31 to transition from "H" to "L". On the other hand, the voltage of the local bit line LBL31 is maintained at "H".

Thereafter, at time t23, the precharge driver 13 sets the precharge line GPRE from "H" to "L". Thereby, precharging of the global bit lines GBL1 and GBLX1 to "H" is started. Subsequently, at time t24, the precharge driver 13 sets the precharge line GPRE from "L" to "H". Thereby, the precharging of the global bit lines GBL1 and GBLX1 to "H" is stopped.

Thereafter, at time t25, the row decoder and word line driver 11 sets the word lines WL1_0, WL2_0, and WL3_0 to "L". Thereby, the nMOS transistors N13 and N14 of the SRAM cells W1[0] to W3[0] are switched to the off state, and the SRAM cell W1[0] and the local bit line LBL11, and the SRAM cell W1[0] and the local bit line LBLX11 are respectively interrupted from each other. Similarly, the SRAM cell W2[0] and the local bit line LBL21, the SRAM cell W2[0] and the local bit line LBLX21, the SRAM cell W3[0] and the local bit line LBL31, and the SRAM cell W3[0] and the local bit line LBLX31 are respectively interrupted from each other.

Thereafter, at time t26, the global word line driver 12 sets the global word lines GWL1, GWL2, and GWL3 to "H". Thereby, the switching circuits S1 and SX1 are brought to a coupled state, and the local bit line LBL11 and the global bit line GBL1, and the local bit line LBLX11 and the global bit line GBLX1 are respectively brought into conduction. Similarly, the switching circuits S2 and SX2 are brought to a coupled state, and the local bit line LBL21 and the global bit line GBL1, and the local bit line LBLX21 and the global bit line GBLX1 are respectively brought into conduction. Furthermore, the switching circuits S3 and SX3 are also brought to a coupled state, and the local bit line LBL31 and the global bit line GBL1, and the local bit line LBLX31 and the global bit line GBLX1 are respectively brought into conduction.

When the switching circuits SX1 to SX3 are brought to a coupled state, the local bit lines LBLX11, LBLX21, and LBLX31 and the global bit line GBLX1 are brought into conduction, as shown in FIG. 12, causing charge sharing. Thereby, the global bit line GBLX1 at "H" decreases in the voltage level by the amount of capacitances of the local bit lines LBLX11 and LBLX31 at "L". That is, the voltage of the global bit line GBLX1 transitions to a voltage level between "H" and "L" according to the voltages of the local bit lines LBLX11, LBLX21, and LBLX31.

Similarly, when the switching circuits S1 to S3 are brought to a coupled state, the local bit lines LBL11, LBL21, and LBL31 and the global bit line GBL1 are brought into conduction, causing charge sharing. Thereby, the global bit line GBL1 at "H" decreases in the voltage level by the amount of capacitance of the local bit line LBL21 at "L". That is, the voltage of the global bit line GBL1 transitions to a voltage level between "H" and "L" according to the voltages of the local bit lines LBL11, LBL21, and LBL31.

Thereafter, the ADC and bit shifter 16 converts a voltage level (analogue value) of the global bit line GBLX1 into a digital value, and outputs the digital value as a signal AS. The accumulator 17 accumulates the signal AS output from the ADC and bit shifter 16, and outputs an accumulated signal ACC.

After that, the global word line driver 12 sets the global word lines GWL1 to GWL3 to "L" in preparation for the subsequent read operation. The precharge driver 13 sets the precharge lines LPRE1 to LPRE3 from "H" to "L", and precharges the local bit lines LBL11 to LBL31 and LBLX11 to LBLX31. After that, the precharge lines LPRE1 to LPRE3 are set back to "H" from "L". Also, the precharge driver 13 sets the precharge line GPRE from "H" to "L", and precharges the glocal bit lines GBL1 and GBLX1. After that, the precharge line GPRE is set back to "H" from "L".

In the above-described operation, according to the number of combinations in which the input signal IN1 is "H" and the SRAM cell Wn stores "H", the charge of the global bit line GBLX1 at "H" is discharged, and the voltage of the global bit line GBLX1 is decreased to a first voltage level. The first voltage level is converted from an analogue value into a digital value by the ADC and bit shifter 16, and output as a signal AS. Based on the signal AS output from the ADC and bit shifter 16, information can be acquired that there are two combinations in which the input signal IN1 is "H" and the SRAM cell Wn is "H".

1.2.4 Multiply-Accumulate Operation (2) of SRAM Cell Wn

Figure 13:
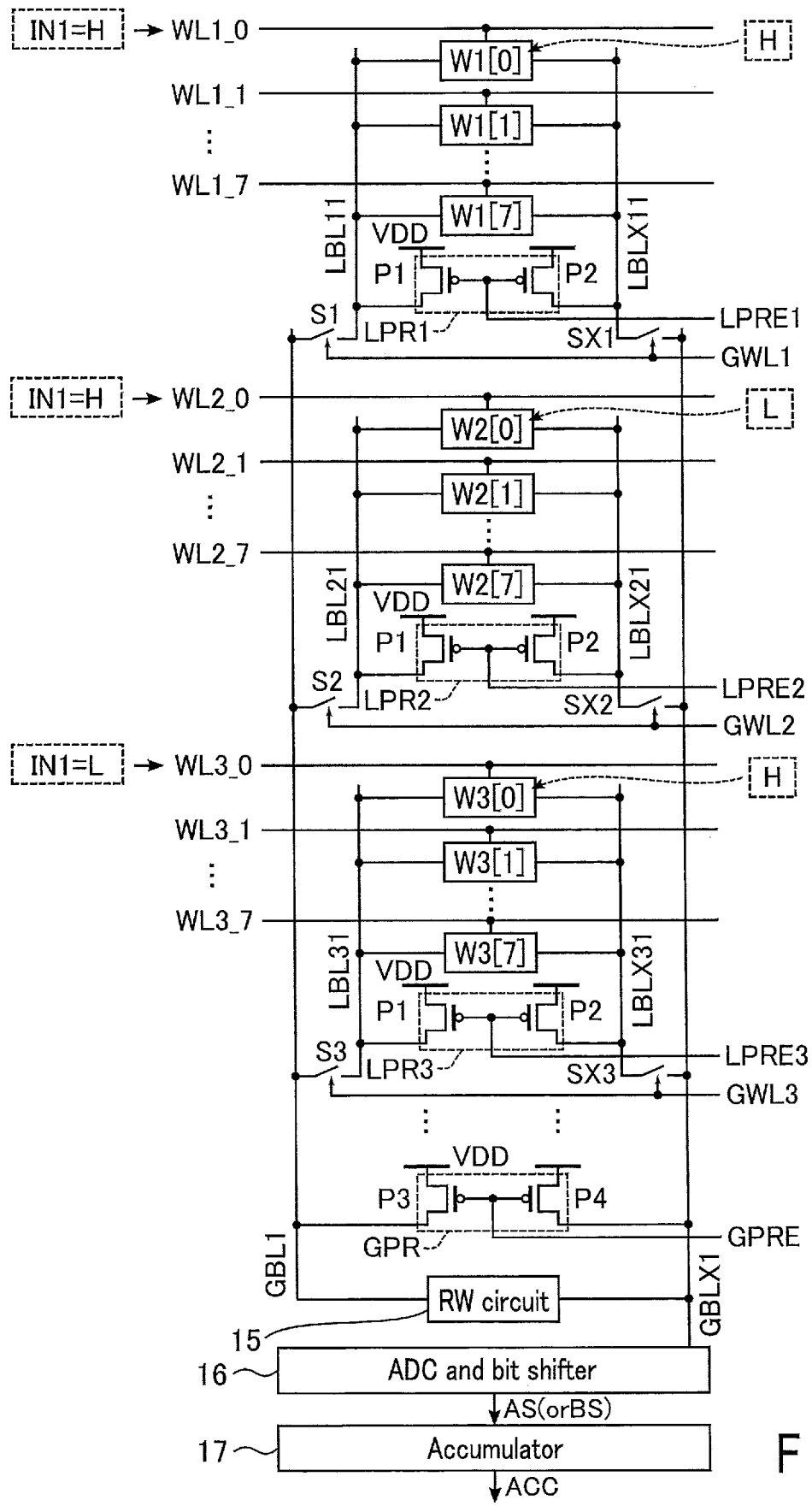
FIG. 13 is a circuit diagram illustrating a second example of a multiply-accumulate operation of an SRAM cell according to the embodiment.
Figure 14:
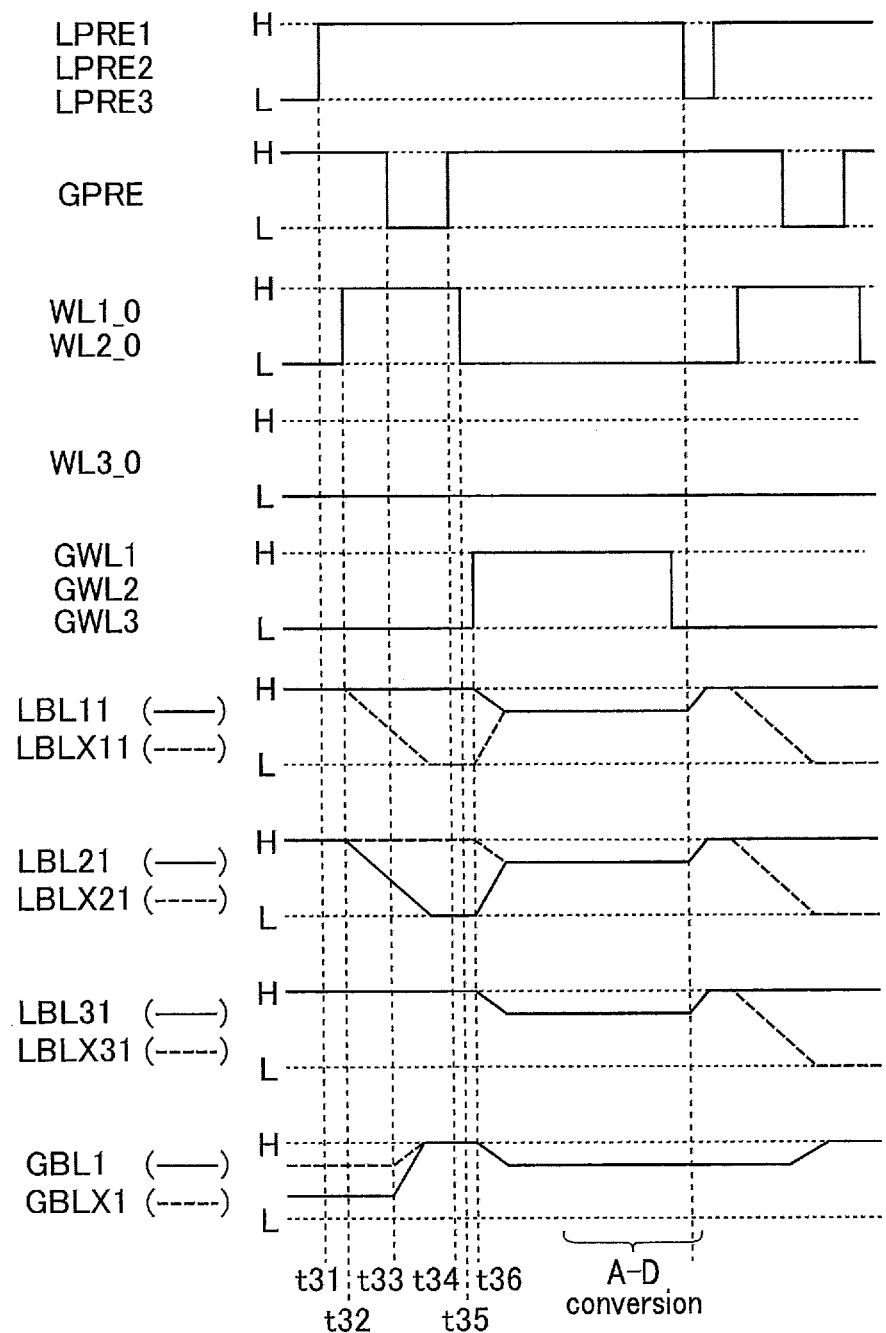
FIG. 14 is a timing chart showing the second example of the multiply-accumulate operation of the SRAM cell according to the embodiment.

Next, another multiply-accumulate operation performed by three SRAM cells W1[0], W2[0], and W3[0] will be described as a second example. FIG. 13 is a circuit diagram illustrating a multiply-accumulate operation of the SRAM cells W1[0], W2[0], and W3[0] according to the second example. FIG. 14 is a timing chart showing the multiply-accumulate operation of the SRAM cells W1[0], W2[0], and W3[0] according to the second example. This arithmetic operation shows a case where there is a single combination in which the input signal IN1 is "H" and the SRAM cell Wn is "H". Examples include a case where the word lines WL1_0 and WL2_0 are set to "H", WL3_0 is set to "L", the SRAM cells W1[0] and W3[0] store "H", and the SRAM cell W2[0] stores "L".

As shown in FIG. 14, the precharge driver 13 sets the precharge lines LPRE1, LPRE2, and LPRE3 from "L" to "H" at time t31. Thereby, the precharging of the local bit lines LBL11, LBL21, LBL31, LBLX11, LBLX21, and LBLX31 to "H" is stopped.

Thereafter, at time t32, the row decoder and word line driver 11 sets the word lines WL1_0 and WL2_0 to "H", and maintains WL3_0 at "L". Thereby, the nMOS transistors N13 and N14 of the SRAM cells W1[0] to W2[0] are switched to the on state, and nMOS transistors N13 and N14 of the SRAM cell W3[0] are kept in the off state. Thus, the SRAM cell W1[0] and the local bit line LBL11, and the SRAM cell W1[0] and the local bit line LBLX11 are respectively brought into conduction. Similarly, the SRAM cell W2[0] and the local bit line LBL21 and the SRAM cell W2[0] and the local bit line LBLX21 are respectively brought into conduction. On the other hand, the SRAM cell W3[0] and the local bit line LBL31 and the SRAM cell W3[0] and the local bit line LBLX31 are kept interrupted from each other.

Since the node W retains "H" and the node WX retains "L" in the SRAM cell W1[0], the charge of the local bit line LBLX11 is discharged. This causes the voltage of the local bit line LBLX11 to transition from "H" to "L". On the other hand, the voltage of the local bit line LBL11 is maintained at "H".

Since the node W retains "L" and the node WX retains "H" in the SRAM cell W2[0], the voltage of the local bit line LBLX21 is maintained at "H". On the other hand, the charge of the local bit line LBL21 is discharged, and the voltage of the local bit line LBL21 transitions from "H" to "L".

Even though the node W retains "H" and the node WX retains "L" in the SRAM cell W3[0], since the SRAM cell W3[0] and the local bit lines LBL31 and LBLX31 are interrupted from each other, the voltages of the local bit lines LBL31 and LBLX31 are maintained at "H".

Thereafter, at time t33, the precharge driver 13 sets the precharge line GPRE from "H" to "L". Thereby, precharging of the global bit lines GBL1 and GBLX1 to "H" is started. Subsequently, at time t34, the precharge driver 13 sets the precharge line GPRE from "L" to "H". Thereby, the precharging of the global bit lines GBL1 and GBLX1 to "H" is stopped.

Thereafter, at time t35, the row decoder and word line driver 11 sets the word lines WL1_0, WL2_0, and WL3_0 to "L". Thereby, the nMOS transistors N13 and N14 of the SRAM cells W1[0] to W3[0] are switched to the off state, and the SRAM cell W1[0] and the local bit line LBL11, and the SRAM cell W1[0] and the local bit line LBLX11 are respectively interrupted from each other. Similarly, the SRAM cell W2[0] and the local bit line LBL21, the SRAM cell W2[0] and the local bit line LBLX21, the SRAM cell W3[0] and the local bit line LBL31, and the SRAM cell W3[0] and the local bit line LBLX31 are respectively interrupted from each other.

Thereafter, at time t36, the global word line driver 12 sets the global word lines GWL1, GWL2, and GWL3 to "H". Thereby, the switching circuits S1 and SX1 are brought to the coupled state, and the local bit line LBL11 and the global bit line GBL1, and the local bit line LBLX11 and the global bit line GBLX1 are respectively brought into conduction. Similarly, the switching circuits S2 and SX2 are brought to the coupled state, and the local bit line LBL21 and the global bit line GBL1, and the local bit line LBLX21 and the global bit line GBLX1 are respectively brought into conduction. Furthermore, the switching circuits S3 and SX3 are also brought to the coupled state, and the local bit line LBL31 and the global bit line GBL1, and the local bit line LBLX31 and the global bit line GBLX1 are respectively brought into conduction.

When the switching circuits SX1 to SX3 are brought to the coupled state, the local bit lines LBLX11, LBLX21, and LBLX31 and the global bit line GBLX1 are brought into conduction, as shown in FIG. 14, causing charge sharing. Thereby, the global bit line GBLX1 at "H" decreases in the voltage level by the amount of capacitance of the local bit line LBLX11 at "L". That is, the voltage of the global bit line GBLX1 transitions to a voltage level between "H" and "L" according to the voltages of the local bit lines LBLX11, LBLX21, and LBLX31.

Similarly, when the switching circuits S1 to S3 are brought to the coupled state, the local bit lines LBL11, LBL21, and LBL31 and the global bit line GBL1 are brought into conduction, causing charge sharing. Thereby, the global bit line GBL1 at "H" decreases in the voltage level by the amount of capacitance of the local bit line LBL21 at "L". That is, the voltage of the global bit line GBL1 transitions to a voltage level between "H" and "L" according to the voltages of the local bit lines LBL11, LBL21, and LBL31.

Thereafter, the ADC and bit shifter 16 converts a voltage level of the global bit line GBLX1 into a digital value, and outputs the digital value as a signal AS. The accumulator 17 accumulates the signal AS output from the ADC and bit shifter 16, and outputs an accumulated signal ACC.

After that, the global word line driver 12 sets the global word lines GWL1 to GWL3 to "L" in preparation for the subsequent read operation. The precharge driver 13 sets the precharge lines LPRE1 to LPRE3 from "H" to "L", and precharges the local bit lines LBL11 to LBL31 and LBLX11 to LBLX31. After that, the precharge lines LPRE1 to LPRE3 are set back to "H" from "L". Also, the precharge driver 13 sets the precharge line GPRE from "H" to "L", and precharges the global bit lines GBL1 and GBLX1. After that, the precharge line GPRE is set back to "H" from "L".

In the above-described operation, according to the number of combinations in which the input signal IN1 is "H" and the SRAM cell Wn stores "H", the charge of the global bit line GBLX1 at "H" is discharged, and the voltage of the global bit line GBLX1 is decreased to a second voltage level. The second voltage level is converted from an analogue value into a digital value and output as a signal AS by the ADC and bit shifter 16. Based on the signal AS output from the ADC and bit shifter 16, information can be acquired that there is a single combination in which the input signal IN1 is "H" and the SRAM cell Wn is "H".

1.2.5 Multiply-Accumulate Operation (3) of SRAM Cell Wn

After a multiply-accumulate operation of the SRAM cell Wn with the same weight WE ends, the processing shifts to a multiply-accumulate operation of an SRAM cell Wn with another weight WE, and repeatedly performs a multiply-accumulate operation until a multiply-accumulate operation of the SRAM cell Wn with a designated weight ends.

Figure 15:
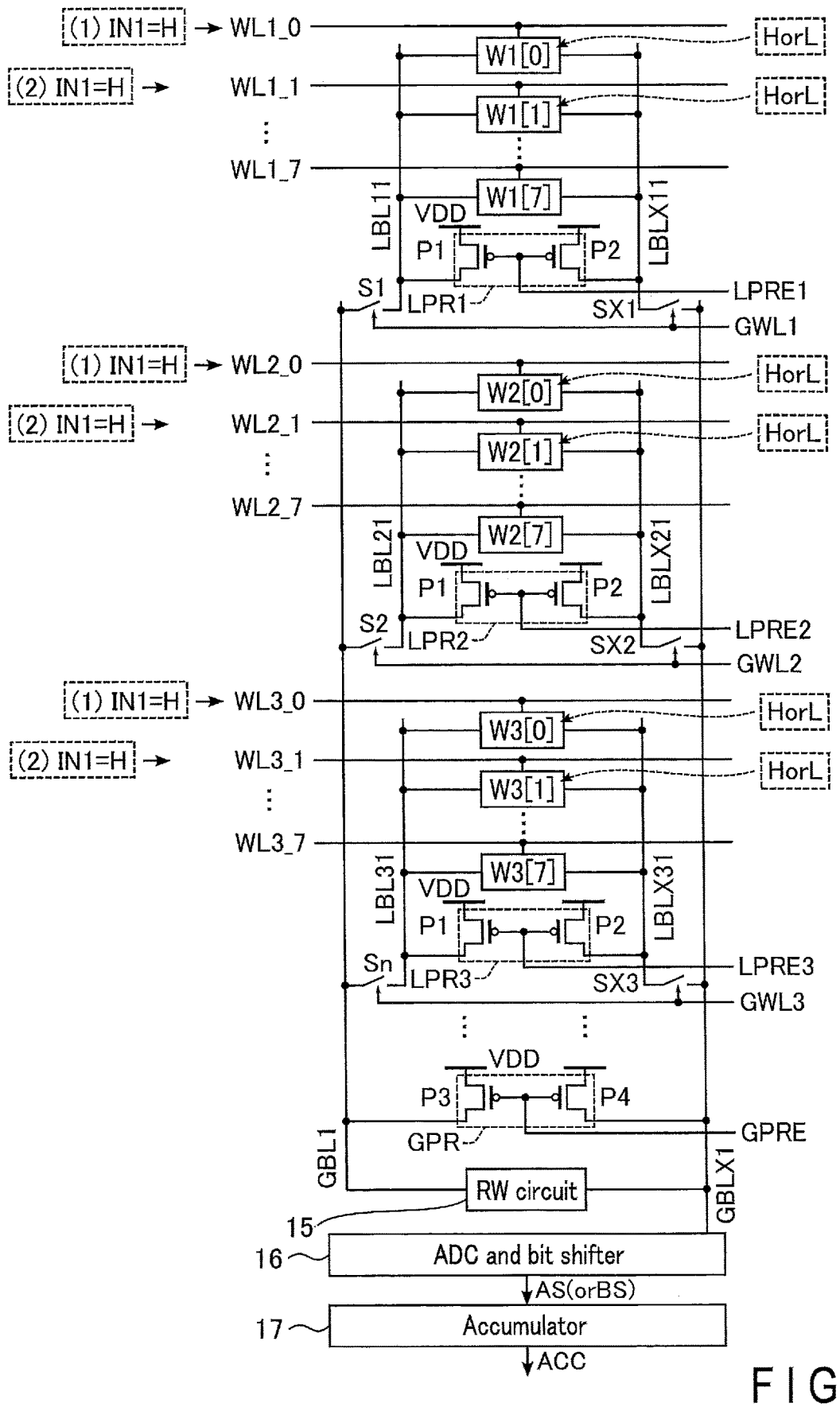
FIG. 15 is a circuit diagram illustrating a third example of a multiply-accumulate operation of an SRAM cell according to the embodiment.
Figure 16:
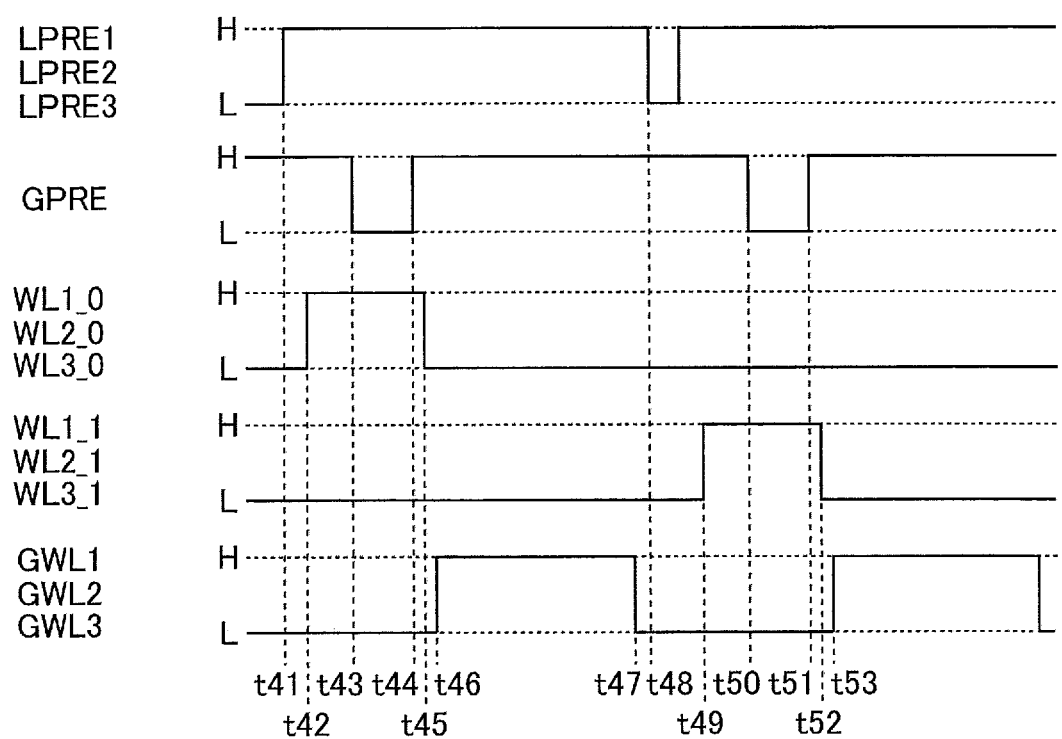
FIG. 16 is a timing chart showing the third example of the multiply-accumulate operation of the SRAM cell according to the embodiment.

A case will be described, as a third example, where a multiply-accumulate operation is performed by the SRAM cells W1[1], W2[1], and W3[1] after a multiply-accumulate operation by the SRAM cells W1[0], W2[0], and W3[0] ends. FIG. 15 is a circuit diagram illustrating the multiply-accumulate operations of the SRAM cells W1[0] to W3[0], and W1[1] to W3[1] according to the third example. FIG. 16 is a timing chart showing the multiply-accumulate operations according to the third example.

First, the multiply-accumulate operation of SRAM cells W1[0], W2[0], and W3[0] is performed. As shown in FIG. 16, the precharge driver 13 sets the precharge lines LPRE1, LPRE2, and LPRE3 from "L" to "H" at time t41. Thereby, the precharging of the local bit lines LBL11, LBL21, LBL31, LBLX11, LBLX21, and LBLX31 to "H" is stopped.

Thereafter, at time t42, the row decoder and word line driver 11 sets the word lines WL1_0, WL2_0, and WL3_0 to "H". Thereby, the nMOS transistors N13 and N14 of the SRAM cells W1[0] to W3[0] are switched to the on state. Thus, the SRAM cell W1[0] and the local bit lines LBL11 and LBLX11, the SRAM cell W2[0] and the local bit lines LBL21 and LBLX21, and the SRAM cell W3[0] and the local bit lines LBL31 and LBLX31 are respectively brought into conduction.

Here, when the SRAM cell W1[0] and the local bit line LBLX11 are brought into conduction, the charge of the local bit line LBLX11 is discharged according to data stored in the SRAM cell W1[0]. There may be a case where the discharging is not performed. This causes the voltage of the local bit line LBLX11 to transition between "H" and "L". Similarly, when the SRAM cell W2[0] and the local bit line LBLX21 are brought into conduction, the charge of the local bit line LBLX21 is discharged according to data stored in the SRAM cell W2[0]. There may be a case where the discharging is not performed. This causes the voltage of the local bit line LBLX21 to transition between "H" and "L". Furthermore, when the SRAM cell W3[0] and the local bit line LBLX31 are brought into conduction, the charge of the local bit line LBLX31 is discharged according to data stored in the SRAM cell W3[0]. There may be a case where the discharging is not performed. This causes the voltage of the local bit line LBLX31 to transition between "H" and "L".

Thereafter, at time t43, the precharge driver 13 sets the precharge line GPRE from "H" to "L". Thereby, precharging of the global bit lines GBL1 and GBLX1 to "H" is started. Subsequently, at time t44, the precharge driver 13 sets the precharge line GPRE from "L" to "H". Thereby, the precharging of the global bit lines GBL1 and GBLX1 to "H" is stopped.

Thereafter, at time t45, the row decoder and word line driver 11 sets the word lines WL1_0, WL2_0, and WL3_0 to "L". Thereby, the nMOS transistors N13 and N14 of the SRAM cells W1[0] to W3[0] are switched to the off state. Thus, the SRAM cell W1[0] and the local bit line LBL11, and the SRAM cell W1[0] and the local bit line LBLX11 are respectively interrupted from each other. Similarly, the SRAM cell W2[0] and the local bit line LBL21, the SRAM cell W2[0] and the local bit line LBLX21, the SRAM cell W3[0] and the local bit line LBL31, and the SRAM cell W3[0] and the local bit line LBLX31 are respectively interrupted from each other.

Thereafter, at time t46, the global word line driver 12 sets the global word lines GWL1, GWL2, and GWL3 to "H". Thereby, the switching circuits SX1 to SX3 are brought to the coupled state.

When the switching circuits SX1 to SX3 are brought to the coupled state, the local bit lines LBLX11, LBLX21, and LBLX31 and the global bit line GBLX1 are brought into conduction, causing charge sharing. This causes the voltage of the global bit line GBLX1 to transition to a voltage level between "H" and "L" according to the voltages of the local bit lines LBLX11, LBLX21, and LBLX31.

Thereafter, the ADC and bit shifter 16 converts a voltage level of the global bit line GBLX1 into a digital value, and outputs the digital value as a signal AS. The accumulator 17 adds, to the value stored therein, the signal AS output from the ADC and bit shifter 16, and outputs an accumulated signal ACC. After that, at time t47, the global word line driver 12 sets the global word lines GWL1 to GWL3 to "L". Thereby, the switching circuits SX1 to SX3 are brought to a decoupled state.

Thereafter, a multiply-accumulate operation of the SRAM cells W1[1], W2[1], and W3[1] is performed. At time t48, the precharge driver 13 sets the precharge lines LPRE1 to LPRE3 to "L" from "H", and sets them back to "H" from "L" after a particular period of time has passed. Thereby, the local bit lines LBL11, LBL21, LBL31, LBLX11, LBLX21, and LBLX31 are precharged to "H", and then the precharging is stopped.

Thereafter, at time t49, the row decoder and word line driver 11 sets the word lines WL1_1, WL2_1, and WL3_1 to "H". Thereby, the nMOS transistors N13 and N14 of the SRAM cells W1[1] to W3[1] are switched to the on state. Thus, the SRAM cell W1[1] and the local bit lines LBL11 and LBLX11, the SRAM cell W2[1] and the local bit lines LBL21 and LBLX21, and the SRAM cell W3[1] and the local bit lines LBL31 and LBLX31 are respectively brought into conduction.

Here, when the SRAM cell W1[1] and the local bit line LBLX11 are brought into conduction, the charge of the local bit line LBLX11 is discharged according to data stored in the SRAM cell W1[1]. There may be a case where the discharging is not performed. This causes the voltage of the local bit line LBLX11 to transition between "H" and "L". Similarly, when the SRAM cell W2[1] and the local bit line LBLX21 are brought into conduction, the charge of the local bit line LBLX21 is discharged according to data stored in the SRAM cell W2[1]. There may be a case where the discharging is not performed. This causes the voltage of the local bit line LBLX21 to transition between "H" and "L". Furthermore, when the SRAM cell W3[1] and the local bit line LBLX31 are brought into conduction, the charge of the local bit line LBLX31 is discharged according to data stored in the SRAM cell W3[1]. There may be a case where the discharging is not performed. This causes the voltage of the local bit line LBLX31 to transition between "H" and "L".

Thereafter, at time t50, the precharge driver 13 sets the precharge line GPRE from "H" to "L". Thereby, precharging of the global bit lines GBL1 and GBLX1 to "H" is started. Subsequently, at time t51, the precharge driver 13 sets the precharge line GPRE from "L" to "H". Thereby, the precharging of the global bit lines GBL1 and GBLX1 to "H" is stopped.

Thereafter, at time t52, the row decoder and word line driver 11 sets the word lines WL1_1, WL2_1, and WL3_1 to "L". Thereby, the nMOS transistors N13 and N14 of the SRAM cells W1[1] to W3[1] are switched to the off state. Thus, the SRAM cell W1[1] and the local bit line LBL11, and the SRAM cell W1[1] and the local bit line LBLX11 are respectively interrupted from each other. Similarly, the SRAM cell W2[1] and the local bit line LBL21, the SRAM cell W2[1] and the local bit line LBLX21, the SRAM cell W3[1] and the local bit line LBL31, and the SRAM cell W3[1] and the local bit line LBLX31 are respectively interrupted from each other.

Thereafter, at time t53, the global word line driver 12 sets the global word lines GWL1, GWL2, and GWL3 to "H". Thereby, the switching circuits SX1 to SX3 are brought to the coupled state.

When the switching circuits SX1 to SX3 are brought to the coupled state, the local bit lines LBLX11, LBLX21, and LBLX31 and the global bit line GBLX1 are brought into conduction, causing charge sharing. This causes the voltage of the global bit line GBLX1 to transition to a voltage level between "H" and "L" according to the voltages of the local bit lines LBLX11, LBLX21, and LBLX31.

Thereafter, the ADC and bit shifter 16 converts the voltage level of the global bit line GBLX1 into a digital value, and outputs the digital value as a signal AS. The signal AS is shifted left by the ADC and bit shifter 16 according to a weight WE2 assigned to the SRAM cells W1[1] to W3[1], and output as a signal BS. The accumulator 17 adds, to the signal ACC stored therein, the signal BS output from the ADC and bit shifter 16, and outputs an accumulated signal ACC.

1.2.6 Multiply-Accumulate Operation of Input Signal INn (1 Bit)×Cell Wn (1 Bit)

Next, a multiply-accumulate operation in a case where the input signal INn is 1 bit and the SRAM cell Wn is 1 bit (hereinafter referred to as "1-bit by 1-bit") will be described.

Figure 17:
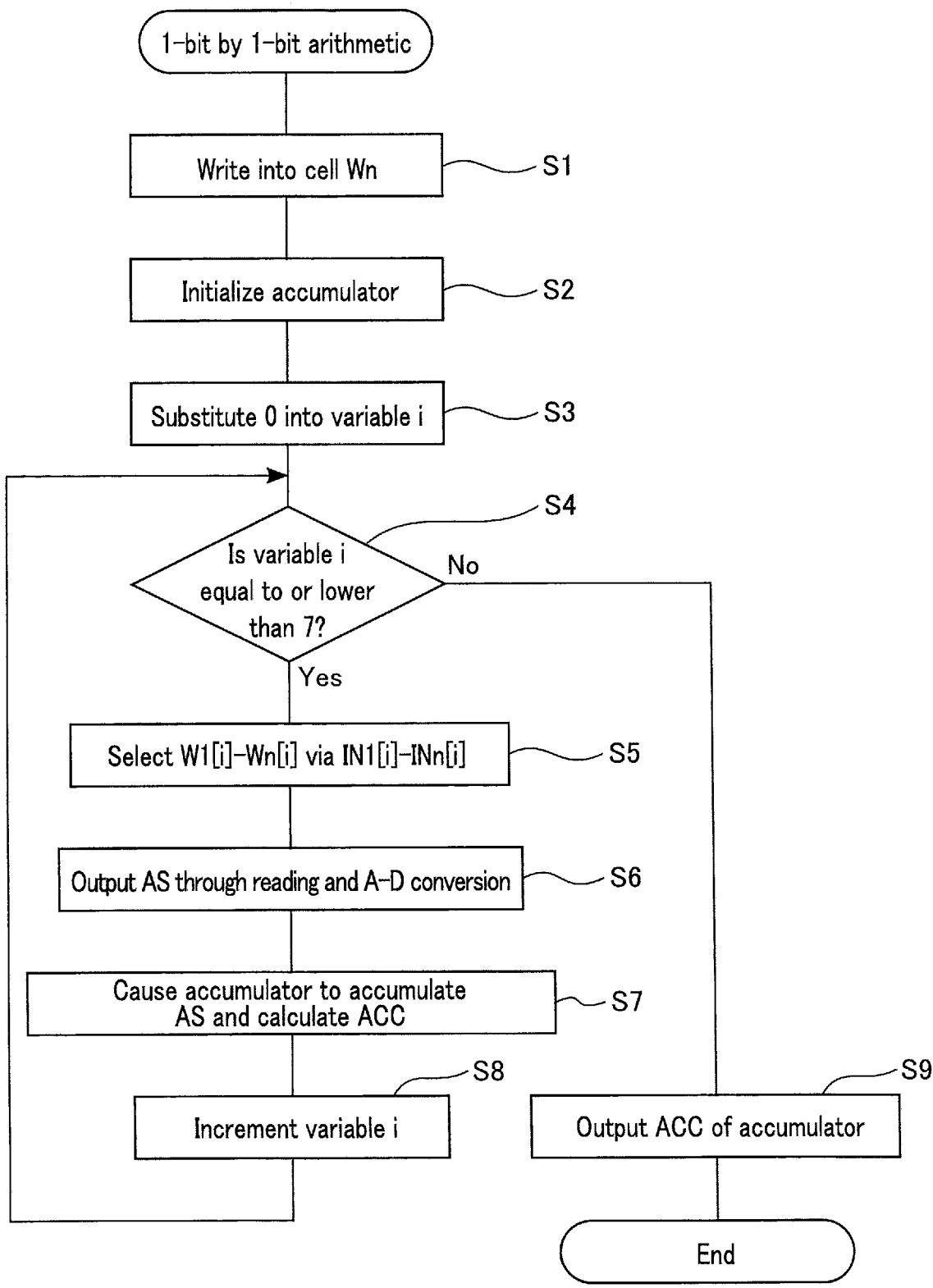
FIG. 17 is a flowchart showing a 1-bit by 1-bit multiply-accumulate operation in the arithmetic device according to the embodiment.
Figure 18:
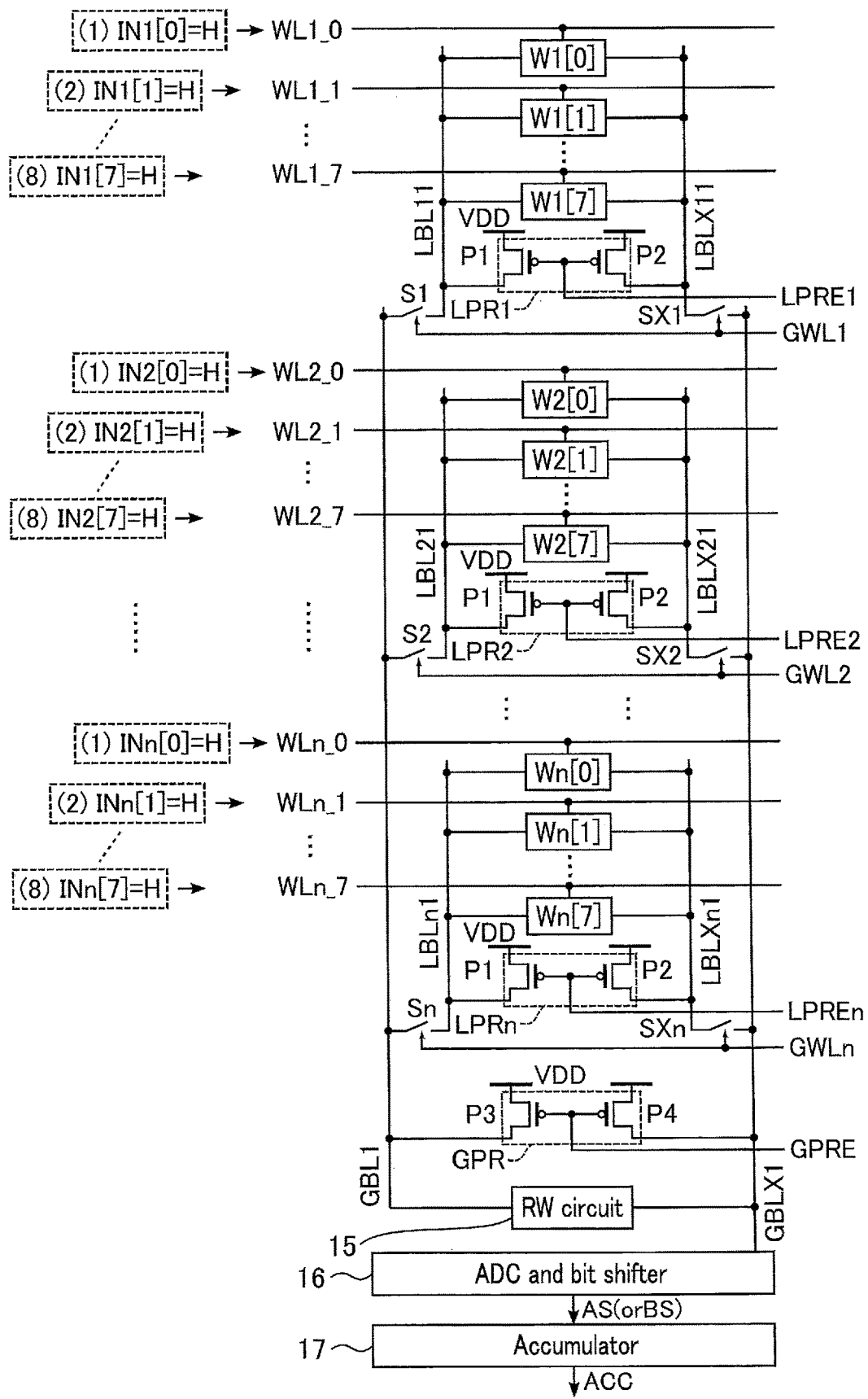
FIG. 18 is a circuit diagram illustrating the 1-bit by 1-bit multiply-accumulate operation according to the embodiment.
Figure 19:
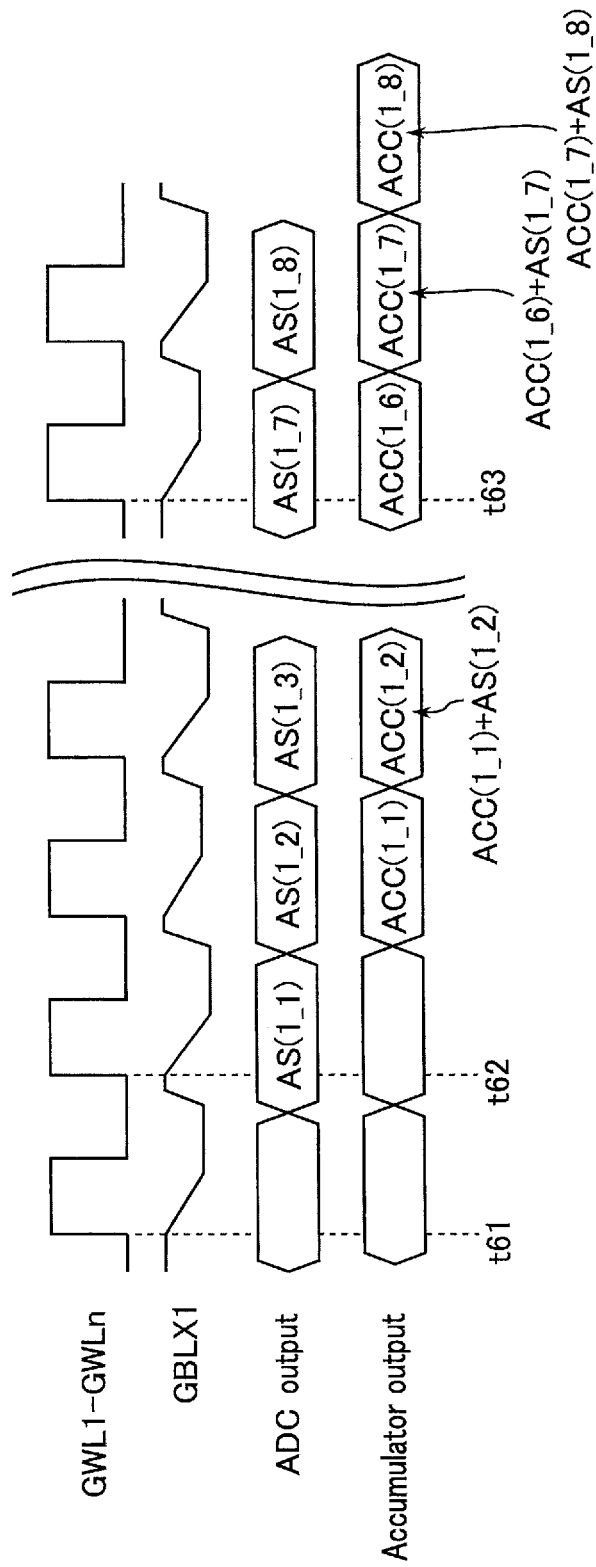
FIG. 19 is a timing chart of the 1-bit by 1-bit multiply-accumulate operation according to the embodiment.

FIG. 17 is a flowchart showing a 1-bit by 1-bit multiply-accumulate operation in the arithmetic device 10. FIG. 18 is a circuit diagram illustrating the 1-bit by 1-bit multiply-accumulate operation. FIG. 19 is a timing chart of the 1-bit by 1-bit multiply-accumulate operation. The operations in the flowchart shown in FIG. 17 are performed by the controller 14.

As shown in FIG. 17, when the multiply-accumulate operation starts, the RW circuit 15 writes data into the SRAM cell Wn in accordance with an instruction from the controller 14 (S1). Thereafter, the controller 14 initializes the accumulated value of the accumulator 17 to 0 (S2). Also, the controller 14 substitutes 0 into a variable i (where i is an integer equal to or greater than 0) (S3).

Thereafter, the controller 14 determines whether the variable i is equal to or lower than 7 (S4). When the variable i is equal to or lower than 7 (Yes), the controller 14 shifts the processing to S5, and performs the processing at step S5 and thereafter. At step S5, in response to an instruction from the controller 14, the row decoder and word line driver 11 causes the input signals IN1[$i$] to INn[$i$], namely, the word lines WL1_$i$ to WLn_$i$ to select SRAM cells W1[$i$] to Wn[$i$]. When, for example, the variable i is 0, the SRAM cells W1[0] to Wn[0] are selected by the input signals IN1[0] to INn[0].

Thereafter, in response to an instruction from the controller 14, the RW circuit 15 reads data from the selected SRAM cells W1[$i$] to Wn[$i$]. The ADC and bit shifter 16 converts the read data into a digital value. Specifically, the charge of the local bit line LBLXn1 and the global bit line GBLX1 is discharged according to data in the selected SRAM cells W1[$i$] to Wn[$i$]. This causes the voltage of the global bit line GBLX1 to transition to a voltage level between "H" and "L". The voltage level of the global bit line GBLX1 is converted into a digital value by the ADC and bit shifter 16, and output as a signal AS (S6).

Thereafter, in response to an instruction from the controller 14, the accumulator 17 adds, to the signal ACC stored therein, the signal AS output from the ADC and bit shifter 16, and calculates an accumulated signal ACC (S7).

Thereafter, the controller 14 increments the value of the variable i (S8). Subsequently, the controller 14 returns the processing back to S4, and determines again whether or not the variable i is equal to or lower than 7. When the variable i is equal to or lower than 7, the controller 14 repeats the processing from S5 to S8.

At S4, when the variable i is greater than 7, the controller 14 shifts the processing to S9, and outputs the signal ACC stored in the accumulator 17. This is the end of the 1-bit by 1-bit multiply-accumulate operation.

Hereinafter, some of the operations in the flowchart shown in FIG. 17 will be described with reference to FIGS. 18 and 19. The operations at S5 to S7 in the flowchart when the variable i is 0 will be described below.

The input signals IN1[0] to INn[0] are set to "H", and the SRAM cells W1[0] to Wn[0] are selected. Thereby, data in the SRAM cells W1[0] to Wn[0] are respectively read into the local bit lines LBLX11 to LBLXn1. Specifically, according to the data stored in the SRAM cells W1[0] to Wn[0], the charge of the local bit lines LBLX11 to LBLXn1 is discharged, and the voltages of the local bit lines LBLX11 to LBLXn1 transition to a voltage level between "H" and "L".

Thereafter, at time t61, the voltages of the global word lines GWL1 to GWLn are set to "H". Thereby, the data read into the local bit lines LBLX11 to LBLXn1 is read into the global bit line GBLX1. Specifically, according to the voltages of the local bit lines LBLX11 to LBLXn1, the charge of the global bit line GBLX1 is discharged, and the voltage of the global bit line GBLX1 transitions to a voltage level between "H" and "L".

Thereafter, the voltage level of the global bit line GBLX1 is converted into a digital value by the ADC and bit shifter 16, and output as a signal AS(1_1). The signal AS(1_1) can be expressed by the following formula (1):

$$AS(1\_1) = \sum_{k=1}^{n} IN_k[0] * W_k[0] \quad (1)$$

In this case, for example, IN1[0]×W1[0] becomes "H" when the input signal IN1[0] and the SRAM cell W1[0] are both "H", and otherwise becomes "L". Similarly, INn[0]× Wn[0] becomes "H" when the input signal INn[0] and the SRAM cell Wn[0] are both "H", and otherwise becomes "L".

After that, the signal AS(1_1) output from the ADC and bit shifter 16 is added to the value stored in the accumulator 17, and an accumulated signal ACC(1_1) is output. Here, since the value of the accumulator 17 is initialized to "0" in advance, the signal ACC(1_1) output from the accumulator 17 is the same as the signal AS(1_1). Accordingly, the signal ACC(1_1) can be expressed by the formula (1).

Next, operations at S5 to S7 in the flowchart shown in FIG. 17 when the variable i is 1 will be described below.

The input signals IN1[1] to INn[1] are set to "H", and the SRAM cells W1[1] to Wn[1] are selected. Thereby, data in the SRAM cells W1[1] to Wn[1] are respectively read into the local bit lines LBLX11 to LBLXn1. Specifically, according to the data stored in the SRAM cells W1[1] to Wn[1], the charge of the local bit lines LBLX11 to LBLXn1 is discharged, and the voltages of the local bit lines LBLX11 to LBLXn1 transition to a voltage level between "H" and "L".

Thereafter, at time t62, the voltages of the global word lines GWL1 to GWLn are set to "H". Thereby, the data read into the local bit lines LBLX11 to LBLXn1 is read into the global bit line GBLX1. Specifically, according to the voltages of the local bit lines LBLX11 to LBLXn1, the charge of the global bit line GBLX1 is discharged, and the voltage of the global bit line GBLX1 transitions to a voltage level between "H" and "L".

Thereafter, the voltage level of the global bit line GBLX1 is converted into a digital value by the ADC and bit shifter 16, and output as a signal AS(1_2). The signal AS(1_2) can be expressed by the following formula (2).

$$AS(1\_2) = \sum_{k=1}^{n} IN_k[1] * W_k[1] \quad (2)$$

In this case, for example, IN1[1]×W1[1] becomes "H" when the input signal IN1[1] and the SRAM cell W1[1] are both "H", and otherwise becomes "L". Similarly, INn[1]× Wn[1] becomes "H" when the input signal INn[1] and the SRAM cell Wn[1] are both "H", and otherwise becomes "L".

After that, the signal AS(1_2) output from the ADC and bit shifter 16 is added to the signal ACC(1_1) stored in the accumulator 17, and an accumulated signal ACC(1_2) is output. That is, the signal ACC(1_2) output from the accumulator 17 corresponds to a value to which the signal AS(1_2) is added to the signal ACC(1_1). The signal ACC(1_2) can be expressed by the following formula (3).

$$ACC(1\_2) = \sum_{k=1}^{n} IN_k[0] * W_k[0] + \sum_{k=1}^{n} IN_k[1] * W_k[1] \quad (3)$$

The operations at S5 to S7 in the flowchart shown in FIG. 17 when the variable i ranges from 2 to 7 correspond to the above-described operations in which 2 to 7 are respectively substituted into the variable i of the input signals IN1[i] to INn[i] and the SRAM cells W1[i] to Wn[i]. The operations when the variable i is 7 will be described below.

The input signals IN1[7] to INn[7] are set to "H", and the SRAM cells W1[7] to Wn[7] are selected. Thereby, data in the SRAM cells W1[7] to Wn[7] are respectively read into the local bit lines LBLX11 to LBLXn1. Specifically, according to the data stored in the SRAM cells W1[7] to Wn[7], the charge of the local bit lines LBLX11 to LBLXn1 is discharged, and the voltages of the local bit lines LBLX11 to LBLXn1 transition to a voltage level between "H" and "L".

Thereafter, at time t63, the voltages of the global word lines GWL1 to GWLn are set to "H". Thereby, the data read into the local bit lines LBLX11 to LBLXn1 is read into the global bit line GBLX1. Specifically, according to the voltages of the local bit lines LBLX11 to LBLXn1, the charge of the global bit line GBLX1 is discharged, and the voltage of the global bit line GBLX1 transitions to a voltage level between "H" and "L".

Thereafter, the voltage level of the global bit line GBLX1 is converted into a digital value by the ADC and bit shifter 16, and output as a signal AS(1_8). The signal AS(1_8) can be expressed by the following formula (4).

$$AS(1\_8) = \sum_{k=1}^{n} IN_k[7] * W_k[7] \quad (4)$$

In this case, for example, IN1[7]×W1[7] becomes "H" when the input signal IN1[7] and the SRAM cell W1[7] are both "H", and otherwise becomes "L". Similarly, INn[7]× Wn[7] becomes "H" when the input signal INn[7] and the SRAM cell Wn[7] are both "H", and otherwise becomes "L".

After that, the signal AS(1_8) output from the ADC and bit shifter 16 is added to the signal ACC(1_7) stored in the accumulator 17, and an accumulated signal ACC(1_8) is output. The signal ACC(1_8) output from the accumulator 17 corresponds to a value to which AS(1_8) is added to ACC(1_7). That is, ACC(1_8) corresponds to the value of "AS(1_1)+AS(1_2)+ . . . +AS(1_8)". The signal ACC(1_8) can be expressed by the following formula (5).

$$ACC(1\_8) = \sum_{k=1}^{n} IN_k[0] * W_k[0] + \sum_{k=1}^{n} IN_k[1] * W_k[1] + \ldots + \sum_{k=1}^{n} IN_k[7] * W_k[7] \quad (5)$$

In the operations described above with reference to FIGS. 17 to 19, a case has been described as an example where all the input signals IN1 to INn are "H"; however, the operations are similarly applicable to the case where one or more of the input signals IN1 to INn are "L".

1.2.7 Multiply-Accumulate Operation of Input Signal INn (1 Bit)×Cell Wn (8 Bits)

Next, a multiply-accumulate operation in a case of a 1-bit input signal INn and an 8-bit SRAM cell Wn (hereinafter referred to as "1-bit by 8-bit") will be described.

Figure 20:
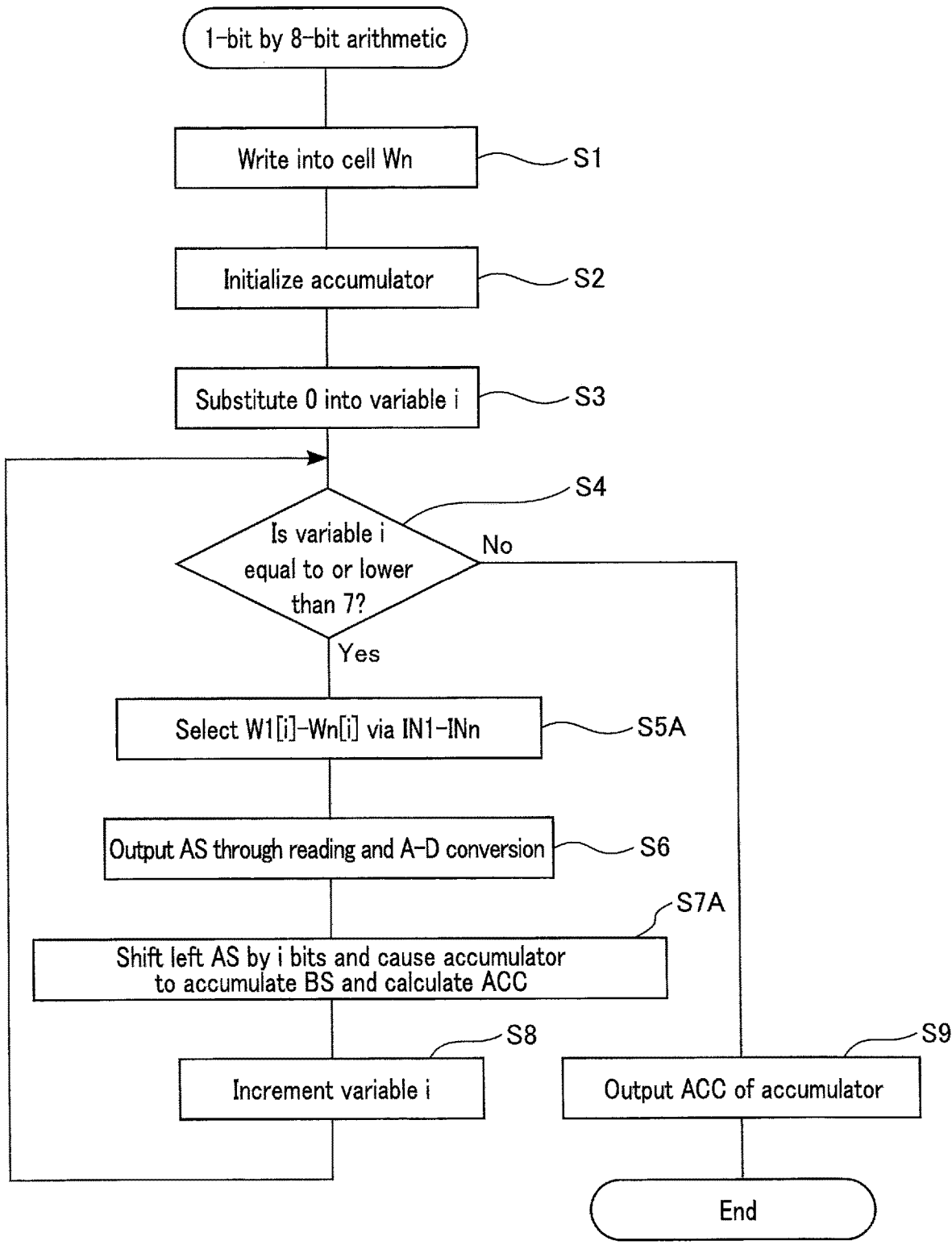
FIG. 20 is a flowchart showing a 1-bit by 8-bit multiply-accumulate operation in the arithmetic device according to the embodiment.
Figure 21:
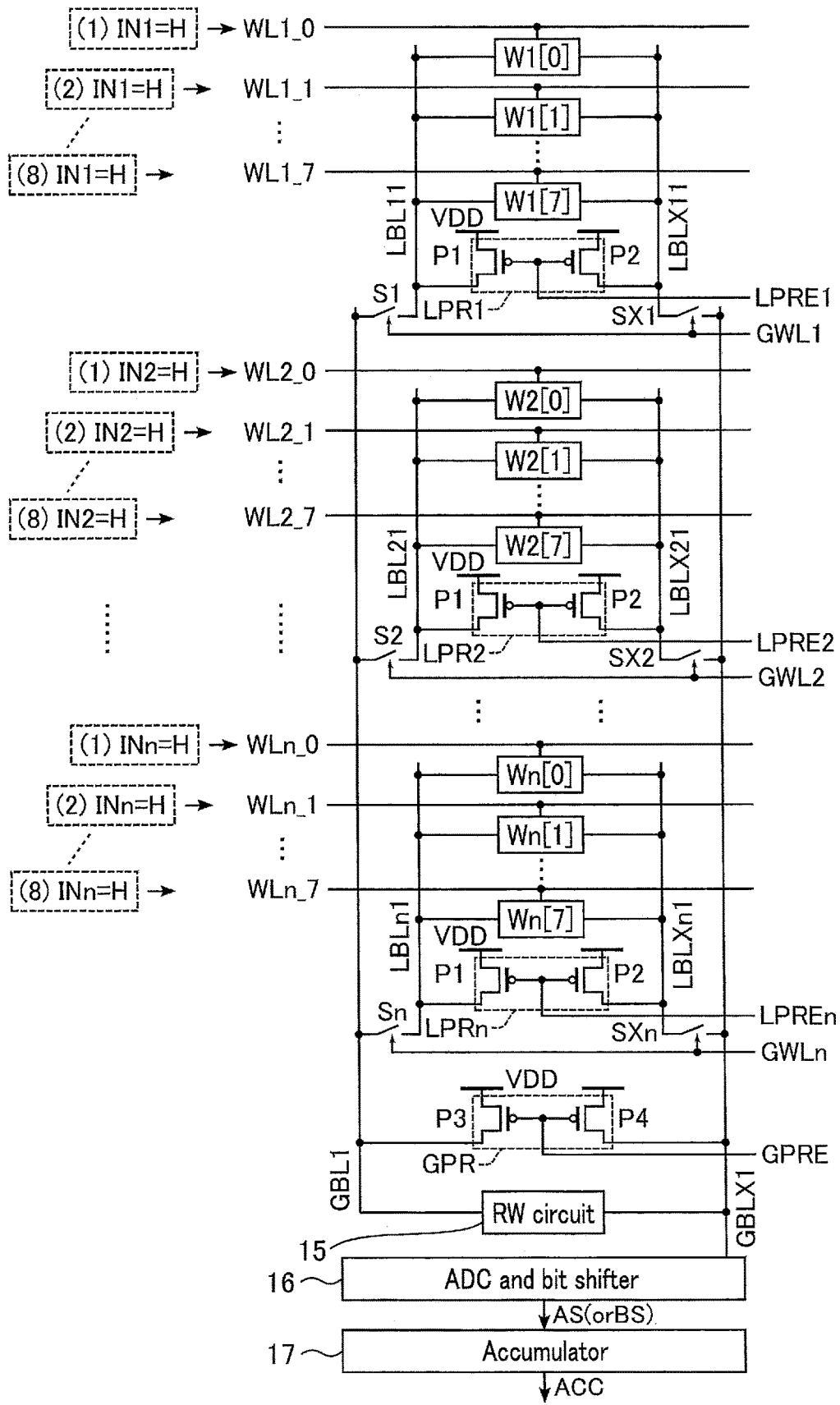
FIG. 21 is a circuit diagram illustrating the 1-bit by 8-bit multiply-accumulate operation according to the embodiment.
Figure 22:
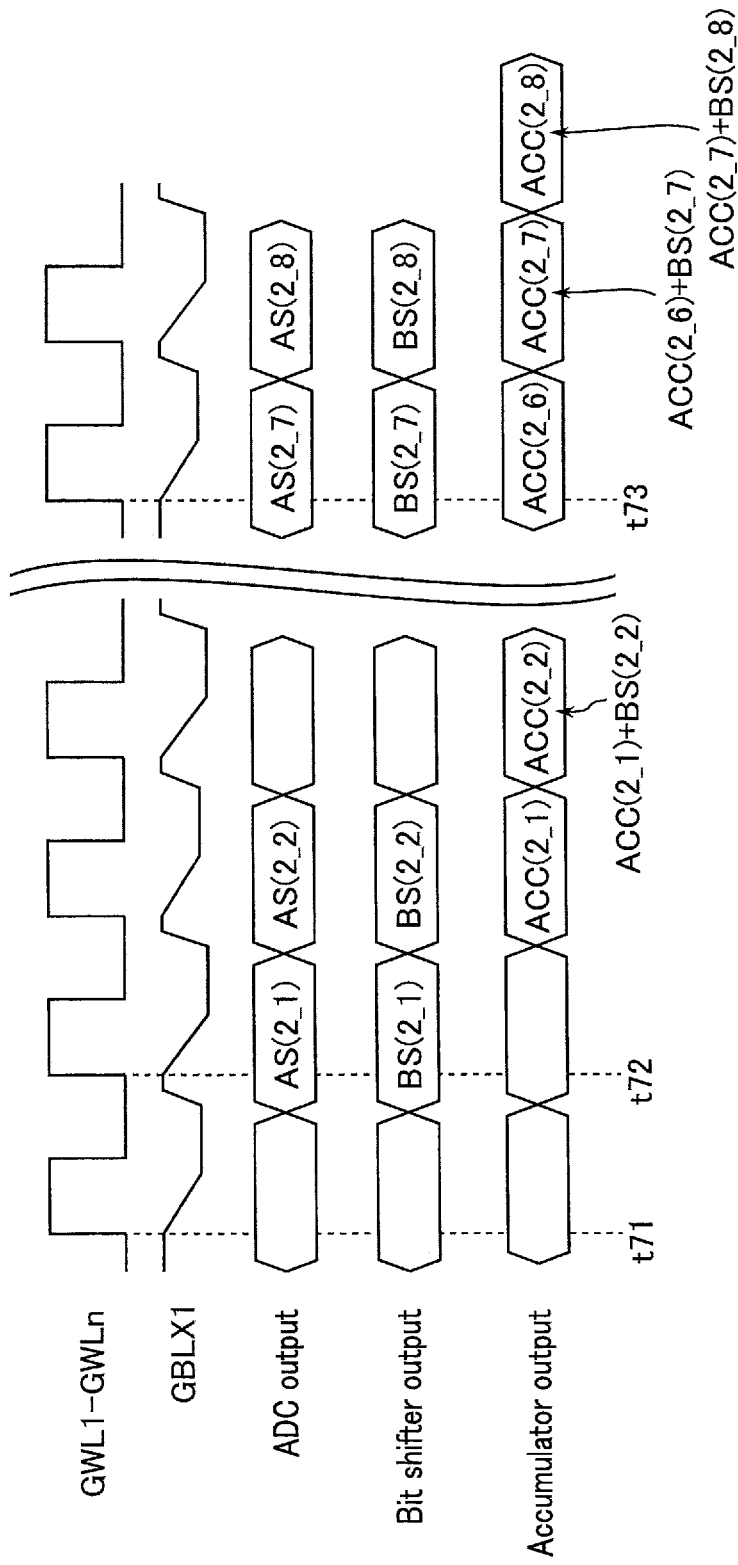
FIG. 22 is a timing chart of the 1-bit by 8-bit multiply-accumulate operation according to the embodiment.

FIG. 20 is a flowchart showing a 1-bit by 8-bit multiply-accumulate operation in the arithmetic device 10. FIG. 21 is a circuit diagram illustrating the 1-bit by 8-bit multiply-accumulate operation. FIG. 22 is a timing chart of the 1-bit by 8-bit multiply-accumulate operation. The operations in the flowchart shown in FIG. 20 are performed by the controller 14.

As shown in FIG. 20, when the multiply-accumulate operation starts, the RW circuit 15 writes data into the SRAM cell Wn in accordance with an instruction from the controller 14 (S1). Thereafter, the controller 14 initializes the accumulated value of the accumulator 17 to 0 (S2). Also, the controller 14 substitutes 0 into a variable i (where i is an integer equal to or greater than 0) (S3).

Thereafter, the controller 14 determines whether or not the variable i is equal to or lower than 7 (S4). When the variable i is equal to or lower than 7 (Yes), the controller 14 shifts the processing to S5A, and performs the processing at step S5A and thereafter. At S5A, in response to an instruction from the controller 14, the row decoder and word line driver 11 causes the input signals IN1 to INn to select SRAM cells W1[i] to Wn[i]. Here, the input signals IN1 to INn respectively correspond to the word lines WL1_i, WL2_i, . . . , and WLn_i. When, for example, the variable i is 0, the SRAM cells W1[0] to Wn[0] are selected by the word lines WL1_0 to WLn_0.

Thereafter, in response to an instruction from the controller 14, the RW circuit 15 reads data from the selected SRAM cells W1[i] to Wn[i]. The ADC and bit shifter 16 converts the read data into a digital value. Specifically, the charge of the local bit line LBLXn1 and the global bit line GBLX1 is discharged according to data in the selected SRAM cells W1[i] to Wn[i]. This causes the voltage of the global bit line GBLX1 to transition to a voltage level between "H" and "L". The voltage level of the global bit line GBLX1 is converted into a digital value by the ADC and bit shifter 16, and output as a signal AS (S6).

The signal AS is shifted left by i bits by the ADC and bit shifter 16, and the left-shifted digital value is output as a signal BS. In response to an instruction from the controller 14, the accumulator 17 adds, to the signal ACC stored therein, the signal BS output from the ADC and bit shifter 16, and calculates an accumulated signal ACC (S7A).

Thereafter, the controller 14 increments the value of the variable i (S8). Subsequently, the controller 14 returns the processing back to S4, and determines again whether or not the variable i is equal to or lower than 7. When the variable i is equal to or lower than 7, the controller 14 repeats the processing from S5A to S8.

At S4, when the variable i is greater than 7, the controller 14 shifts the processing to S9, and outputs the signal ACC stored in the accumulator 17. This is the end of the 1-bit by 8-bit multiply-accumulate operation.

Hereinafter, some of the operations in the flowchart shown in FIG. 20 will be described with reference to FIGS. 21 and 22. The operations at S5A to S7A in the flowchart when the variable i is 0 will be described below.

The input signals IN1 to INn, namely, the word lines WL1_0 to WLn_0 are set to "H", and the SRAM cells W1[0] to Wn[0] are selected. Thereby, data in the SRAM cells W1[0] to Wn[0] are respectively read into the local bit lines LBLX11 to LBLXn1. Specifically, according to the data stored in the SRAM cells W1[0] to Wn[0], the charge of the local bit lines LBLX11 to LBLXn1 is discharged, and the voltages of the local bit lines LBLX11 to LBLXn1 transition to a voltage level between "H" and "L".

Thereafter, at time t71, the voltages of the global word lines GWL1 to GWLn are set to "H". Thereby, the data read into the local bit lines LBLX11 to LBLXn1 is read into the global bit line GBLX1. Specifically, according to the voltages of the local bit lines LBLX11 to LBLXn1, the charge of the global bit line GBLX1 is discharged, and the voltage of the global bit line GBLX1 transitions to a voltage level between "H" and "L".

Thereafter, the voltage level of the global bit line GBLX1 is converted into a digital value by the ADC and bit shifter 16, and output as a signal AS(2_1). The signal AS(2_1) can be expressed by the following formula (6):

$$AS(2\_1) = \sum_{k=1}^{n} IN_k * W_k[0] \quad (6)$$

In this case, for example, IN1×W1[0] becomes "H" when the input signal IN1 and the SRAM cell W1[0] are both "H", and otherwise becomes "L". Similarly, INn×Wn[0] becomes "H" when the input signal INn and the SRAM cell Wn[0] are both "H", and otherwise becomes "L".

After that, the signal AS(2_1) obtained by the conversion by the ADC and bit shifter 16 is further shifted left by i bits by the ADC and bit shifter 16, and the left-shifted digital value is output as a signal BS(2_1). Here, since i equals 0, a left shift is not performed. Accordingly, the signal BS(2_1) is the same as the signal AS(2_1), and can be expressed by the formula (6).

Thereafter, the signal BS(2_1) is added to the value stored in the accumulator 17, and an accumulated signal ACC(2_1) is output (S7A). Here, since the value of the accumulator 17 is initialized to "0" in advance, the signal ACC(2_1) output from the accumulator 17 is the same as the signals BS(2_1) and AS(2_1). Accordingly, the signal ACC(2_1) can be expressed by the formula (6).

Next, the operations at S5A to S7A in the flowchart shown in FIG. 20 when the variable i is 1 will be described below.

The input signals IN1 to INn, namely, the word lines WL1_1 to WLn_1 are set to "H", and the SRAM cells W1[1] to Wn[1] are selected. Thereby, data in the SRAM cells W1[1] to Wn[1] are respectively read into the local bit lines LBLX11 to LBLXn1.

Thereafter, at time t72, the voltages of the global word lines GWL1 to GWLn are set to "H". Thereby, the data read into the local bit lines LBLX11 to LBLXn1 is read into the global bit line GBLX1.

Thereafter, the voltage level of the global bit line GBLX1 is converted into a digital value by the ADC and bit shifter 16, and output as a signal AS(2_2). The signal AS(2_2) can be expressed by the following formula (7).

$$AS(2\_2) = \sum_{k=1}^{n} IN_k * W_k[1] \tag{7}$$

In this case, for example, IN1×W1[1] becomes "H" when the input signal IN1 and the SRAM cell W1[1] are both "H", and otherwise becomes "L". Similarly, INn×Wn[1] becomes "H" when the input signal INn and the SRAM cell Wn[1] are both "H", and otherwise becomes "L".

After that, the signal AS(2_2) obtained by the conversion by the ADC and bit shifter 16 is further shifted left by i bits by the ADC and bit shifter 16, and the left-shifted digital value is output as a signal BS(2_2). The signal BS(2_2) can be expressed by the following formula (8):

$$BS(2\_2) = 2\sum_{k=1}^{n} IN_k * W_k[1] \tag{8}$$

Thereafter, the signal BS(2_2) is added to the signal ACC(2_1) stored in the accumulator 17, and an accumulated signal ACC(2_2) is output (S7A). That is, the signal ACC(2_2) output from the accumulator 17 corresponds to a value to which the signal BS(2_2) is added to the signal ACC(2_1). The signal ACC(2_2) can be expressed by the following formula (9).

$$ACC(2\_2) = \sum_{k=1}^{n} IN_k * W_k[0] + 2\sum_{k=1}^{n} IN_k * W_k[1] \tag{9}$$

The operations at S5A to S7A in the flowchart shown in FIG. 20 when the variable i ranges from 2 to 7 correspond to the above-described operations in which 2 to 7 are respectively substituted into the variable i of the input signals IN1 to INn and the SRAM cells W1[i] to Wn[i]. The operations when the variable i is 7 will be described below.

The input signals IN1 to INn, namely, the word lines WL1_1 to WLn_1 are set to "H", and the SRAM cells W1[7] to Wn[7] are selected. Thereby, data in the SRAM cells W1[7] to Wn[7] are respectively read into the local bit lines LBLX11 to LBLXn1.

Thereafter, at time t73, the voltages of the global word lines GWL1 to GWLn are set to "H". Thereby, the data read into the local bit lines LBLX11 to LBLXn1 is read into the global bit line GBLX1.

Thereafter, the voltage level of the global bit line GBLX1 is converted into a digital value by the ADC and bit shifter 16, and output as a signal AS(2_8). The signal AS(2_8) can be expressed by the following formula (10).

$$AS(2\_8) = \sum_{k=1}^{n} IN_k * W_k[7] \tag{10}$$

In this case, for example, IN1×W1[7] becomes "H" when the input signal IN1 and the SRAM cell W1[7] are both "H", and otherwise becomes "L". Similarly, INn×Wn[7] becomes "H" when the input signal INn and the SRAM cell Wn[7] are both "H", and otherwise becomes "L".

After that, the signal AS(2_8) obtained by the conversion by the ADC and bit shifter 16 is further shifted left by i bits by the ADC and bit shifter 16, and the left-shifted digital value is output as a signal BS(2_8). The signal BS(2_8) can be expressed by the following formula (11):

$$BS(2\_8) = 2^7 \sum_{k=1}^{n} IN_k * W_k[7] \tag{11}$$

Thereafter, the signal BS(2_8) is added to the signal ACC(2_7) stored in the accumulator 17, and an accumulated signal ACC(2_8) is output (S7A). The signal ACC(2_8) output from the accumulator 17 corresponds to a value to which the signal BS(2_8) is added to the signal ACC(2_7). That is, the signal ACC(2_8) corresponds to the value of "BS(2_1)+BS(2_2)+ . . . +BS(2_8)". The signal ACC(2_8) can be expressed by the following formula (12).

$$ACC(2\_8) = \\ \sum_{k=1}^{n} IN_k * W_k[0] + 2\sum_{k=1}^{n} IN_k * W_k[1] + \ldots + 2^7 \sum_{k=1}^{n} IN_k * W_k[7] \tag{12}$$

In the operations described above with reference to FIGS. 20 to 22, a case has been described as an example where all the input signals IN1 to INn are "H"; however, the operations are similarly applicable to the case where one or more of the input signals IN1 to INn are "L".

The 1-bit by 8-bit multiply-accumulate operation has been described above; however, a multiply-accumulate operation of a larger number of bits than 1-bit by 8-bit can be performed by making the number of the SRAM cells Wn coupled to the local bit lines LBLnm and LBLXnm larger than 8. For example, by coupling 16 SRAM cells Wn to the local bit lines LBLnm and LBLXnm, a 1-bit by 16-bit multiply-accumulate operation can be performed. Furthermore, by coupling 32 SRAM cells Wn to the local bit lines LBLnm and LBLXnm, a 1-bit by 32-bit multiply-accumulate operation can be performed.

1.2.8 Multiply-Accumulate Operation of Input Signal INn (4 Bits)×Cell Wn (8 Bits)

Next, a multiply-accumulate operation in a case of a 4-bit input signal INn and an 8-bit SRAM cell Wn (hereinafter referred to as "4-bit by 8-bit") will be described.

Figure 23:
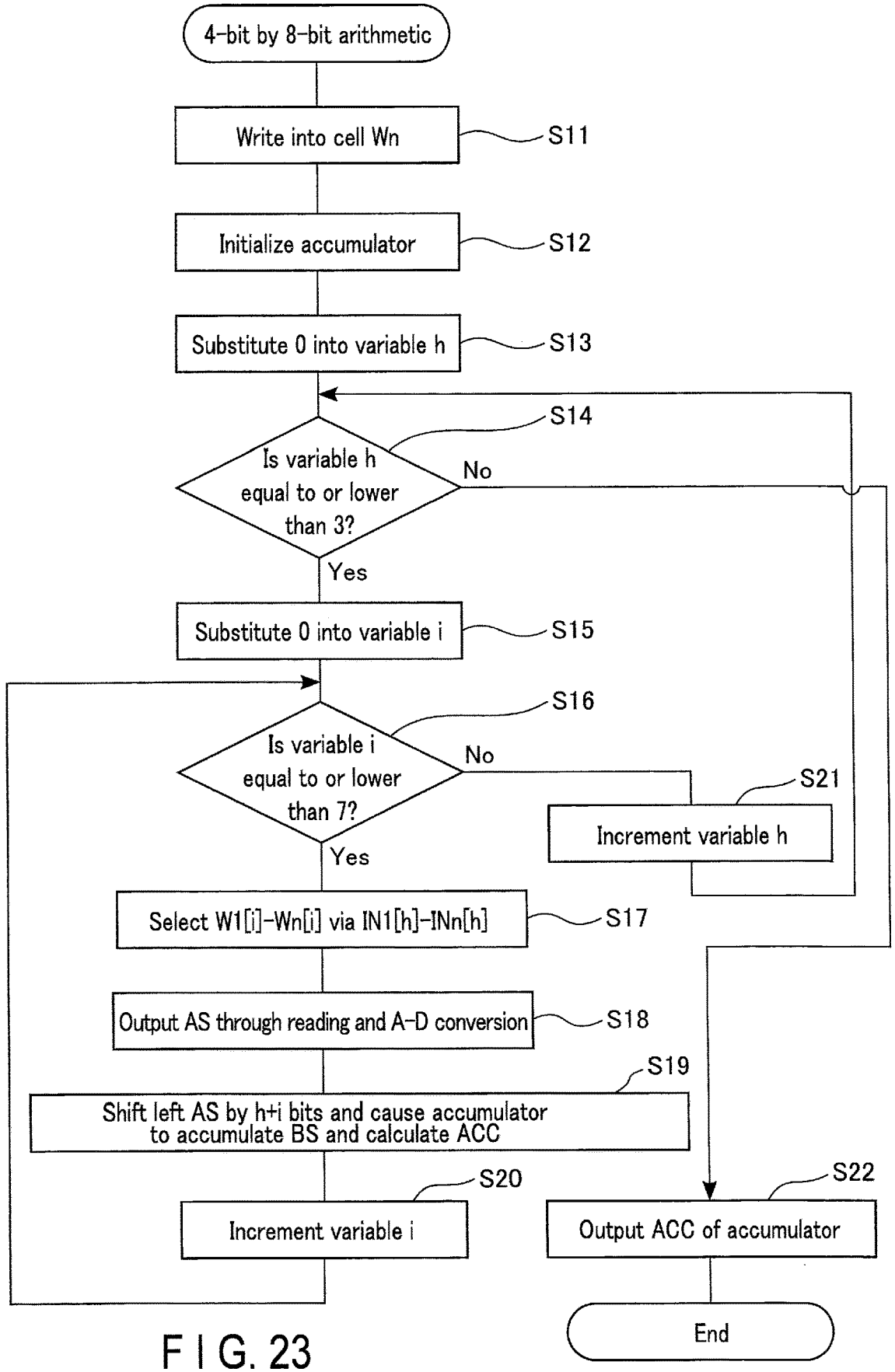
FIG. 23 is a flowchart showing a 4-bit by 8-bit multiply-accumulate operation in the arithmetic device according to the embodiment.
Figure 24:
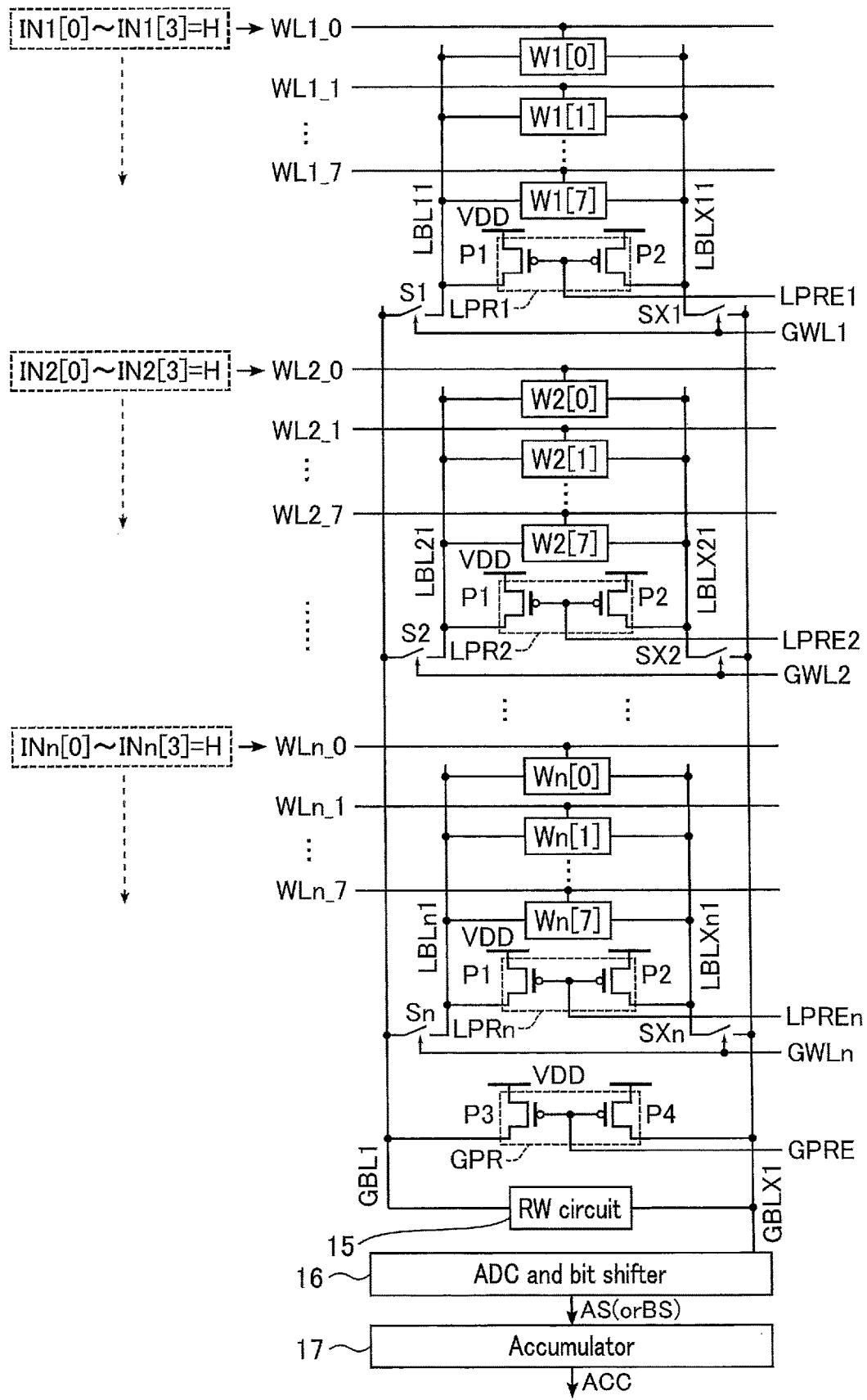
FIG. 24 is a circuit diagram illustrating the 4-bit by 8-bit multiply-accumulate operation according to the embodiment.

FIG. 23 is a flowchart showing a 4-bit by 8-bit multiply-accumulate operation in the arithmetic device 10. FIG. 24 is a circuit diagram illustrating the 4-bit by 8-bit multiply-accumulate operation. FIG. 25 is a timing chart of the 4-bit by 8-bit multiply-accumulate operation. The operations in the flowchart shown in FIG. 23 are performed by the controller 14.

As shown in FIG. 23, when the multiply-accumulate operation starts, the RW circuit 15 writes data into the SRAM cell Wn in accordance with an instruction from the controller 14 (S11). Subsequently, the controller 14 initializes the accumulated value of the accumulator 17 to 0 (S12). Also, the controller 14 substitutes 0 into a variable h (where h is an integer equal to or greater than 0) (S13).

Thereafter, the controller 14 determines whether or not the variable h is equal to or lower than 3 (S14). When the variable h is equal to or lower than 3 (Yes), the controller 14 shifts the processing to S15, and performs the processing at step S15 and thereafter. At S15, the controller 14 substitutes 0 into a variable i (where i is an integer equal to or greater than 0).

Thereafter, the controller 14 determines whether or not the variable i is equal to or lower than 7 (S16). When the variable i is equal to or lower than 7 (Yes), the controller 14 shifts the processing to S17, and performs the processing at step S17 and thereafter. At S17, in response to an instruction from the controller 14, the row decoder and word line driver 11 causes the input signals IN1[h] to INn[h] to select SRAM cells W1[i] to Wn[i]. When, for example, both of the variables h and i are 0, the SRAM cells W1[0] to Wn[0] are selected by the input signals IN1[0] to INn[0], namely, the word lines WL1_0 to WLn_0.

Thereafter, in response to an instruction from the controller 14, the RW circuit 15 reads data from the selected SRAM cells W1[i] to Wn[i]. The ADC and bit shifter 16 converts the read data into a digital value. Specifically, the charge of the local bit line LBLXn1 and the global bit line GBLX1 is discharged according to data in the selected SRAM cells W1[i] to Wn[i]. This causes the voltage of the global bit line GBLX1 to transition to a voltage level between "H" and "L". The voltage level of the global bit line GBLX1 is converted into a digital value by the ADC and bit shifter 16, and output as a signal AS (S18).

Furthermore, the signal AS is shifted left by (h+i) bits by the ADC and bit shifter 16, and the left-shifted digital value is output as a signal BS. In response to an instruction from the controller 14, the accumulator 17 adds, to the signal ACC stored therein, the signal BS output from the ADC and bit shifter 16, and calculates an accumulated signal ACC (S19).

Thereafter, the controller 14 increments the value of the variable i (S20). Subsequently, the controller 14 returns the processing back to S16, and determines again whether or not the variable i is equal to or lower than 7. When the variable i is equal to or lower than 7, the controller 14 repeats the processing from S17 to S20.

At S16, when the variable i is greater than 7, the processing shifts to S21, and the value of the variable h is incremented. Subsequently, returning back to S14, it is determined again whether or not the variable h is equal to or lower than 3. When the variable h is equal to or lower than 3, the processing from S15 to S21 is repeated.

On the other hand, at S14, when the variable h is greater than 3, the controller 14 shifts to S22, and outputs the signal ACC stored in the accumulator 17. This is the end of the 4-bit by 8-bit multiply-accumulate operation.

Hereinafter, some of the operations in the flowchart shown in FIG. 23 will be described with reference to FIGS. 24 and 25. The operations at S17 to S19 in the flowchart when both of the variables h and i are 0 will be described below.

The input signals IN1[0] to INn[0], namely, the word lines WL1_0 to WLn_0 are set to "H", and the SRAM cells W1[0] to Wn[0] are selected. Thereby, data in the SRAM cells W1[0] to Wn[0] are respectively read into the local bit lines LBLX11 to LBLXn1. Specifically, according to the data stored in the SRAM cells W1[0] to Wn[0], the charge of the local bit lines LBLX11 to LBLXn1 is discharged, and the voltages of the local bit lines LBLX11 to LBLXn1 transition to a voltage level between "H" and "L".

Thereafter, at time t81, the voltages of the global word lines GWL1 to GWLn are set to "H". Thereby, the data read into the local bit lines LBLX11 to LBLXn1 is read into the global bit line GBLX1. Specifically, according to the voltages of the local bit lines LBLX11 to LBLXn1, the charge of the global bit line GBLX1 is discharged, and the voltage of the global bit line GBLX1 transitions to a voltage level between "H" and "L".

Thereafter, the voltage level of the global bit line GBLX1 is converted into a digital value by the ADC and bit shifter 16, and output as a signal AS(3_1). The signal AS(3_1) can be expressed by the following formula (13):

$$AS(3\_1) = \sum_{k=1}^{n} IN_k[0] * W_k[0] \qquad (13)$$

After that, the signal AS(3_1) obtained by the conversion by the ADC and bit shifter 16 is further shifted left by (h+i) bits by the ADC and bit shifter 16, and the left-shifted digital value is output as a signal BS(3_1). In this case, since h+i=0, a left shift is not performed. Accordingly, the signal BS(3_1) is the same as the signal AS(3_1), and can be expressed by the formula (13).

Thereafter, the signal BS(3_1) is added to the value stored in the accumulator 17, and an accumulated signal ACC(3_1) is output (S19). Here, since the value of the accumulator 17 is initialized to "0" in advance, the signal ACC(3_1) output from the accumulator 17 is the same as the signals BS(3_1) and AS(3_1). Accordingly, the signal ACC(3_1) can be expressed by the formula (13).

Next, operations at S17 to S19 in the flowchart shown in FIG. 23 when the variable h is 0 and the variable i is 1 will be described below.

The input signals IN1[0] to INn[0], namely, the word lines WL1_0 to WLn_0 are set to "H", and the SRAM cells W1[1] to Wn[1] are selected. Thereby, data in the SRAM cells W1[1] to Wn[1] are respectively read into the local bit lines LBLX11 to LBLXn1.

Thereafter, at time t82, the voltages of the global word lines GWL1 to GWLn are set to "H". Thereby, the data read into the local bit lines LBLX11 to LBLXn1 is read into the global bit line GBLX1.

Subsequently, the voltage level of the global bit line GBLX1 is converted into a digital value by the ADC and bit shifter 16, and output as a signal AS(3_2). The signal AS(3_2) can be expressed by the following formula (14).

$$AS(3\_2) = \sum_{k=1}^{n} IN_k[0] * W_k[1] \qquad (14)$$

Thereafter, the signal AS(3_2) obtained by the conversion by the ADC and bit shifter 16 is further shifted left by (h+i) bits by the ADC and bit shifter 16. Since h+i=1, the signal AS(3_2) is shifted left by 1 bit, and the left-shifted digital value is output as a signal BS(3_2). The signal BS(3_2) can be expressed by the following formula (15):

$$BS(3\_2) = 2\sum_{k=1}^{n} IN_k[0] * W_k[1] \qquad (15)$$

Subsequently, the signal BS(3_2) is added to the signal ACC(3_1) stored in the accumulator 17, and an accumulated signal ACC(3_2) is output (S19). That is, the signal ACC (3_2) output from the accumulator 17 is a value to which the signal BS(3_2) is added to the signal ACC(3_1). The signal ACC(3_2) can be expressed by the following formula (16).

$$ACC(3\_2) = \sum_{k=1}^{n} IN_k[0] * W_k[0] + 2\sum_{k=1}^{n} IN_k[0] * W_k[1] \quad (16)$$

The operations at S17 to S19 in the flowchart shown in FIG. 23 when the variable h is 0 and the variable i ranges from 2 to 7 correspond to the above-described operations in which 0 is substituted into the variable h, and 2 to 7 are respectively substituted into the variable i of the input signals IN1[$h$] to INn[h] and the SRAM cells W1[$i$] to Wn[i], respectively. The operations when the variable h ranges from 1 to 3 and the variable i ranges from 0 to 7 correspond to the above-described operations in which 1 to 3 are substituted into the variable h, and 0 to 7 are substituted into the variable i of the input signals IN1[$h$] to INn[h] and the SRAM cells W1[$i$] to Wn[i], respectively. The operations when the variable h is 3 and the variable i is 7 will be described below.

The input signals IN1[3] to INn[3] are set to "H", and the SRAM cells W1[7] to Wn[7] are selected. Thereby, data in the SRAM cells W1[7] to Wn[7] are respectively read into the local bit lines LBLX11 to LBLXn1.

Thereafter, at time t83, the voltages of the global word lines GWL1 to GWLn are set to "H". Thereby, the data read into the local bit lines LBLX11 to LBLXn1 is read into the global bit line GBLX1.

Thereafter, the voltage level of the global bit line GBLX1 is converted into a digital value by the ADC and bit shifter 16, and output as a signal AS(3_8). The signal AS(3_8) can be expressed by the following formula (17).

$$AS(3\_8) = \sum_{k=1}^{n} IN_k[3] * W_k[7] \quad (17)$$

Thereafter, the signal AS(3_8) obtained by the conversion by the ADC and bit shifter 16 is further shifted left by (h+i) bits by the ADC and bit shifter 16. In this case, since h+i=10, the signal AS(3_8) is shifted left by ten bits, and the left-shifted digital value is output as a signal BS(3_8). The signal BS(3_8) can be expressed by the following formula (18).

$$BS(3\_8) = 2^{10} \sum_{k=1}^{n} IN_k[3] * W_k[7] \quad (18)$$

Thereafter, the signal BS(3_8) is added to the signal ACC(3_7) stored in the accumulator 17, and an accumulated signal ACC(3_8) is output (S19). The signal ACC(3_8) output from the accumulator 17 corresponds to a value to which the signal BS(3_8) is added to the signal ACC(3_7). That is, the signal ACC(3_8) corresponds to the value of "BS(3_1)+BS(3_2)+ . . . +BS(3_8)". The signal ACC(3_8) can be expressed by the following formula (19).

$$ACC(3\_8) = \sum_{k=1}^{n} IN_k[0] * W_k[0] + \ldots + 2^{7} \sum_{k=1}^{n} IN_k[0] * W_k[7] + \quad (19)$$

-continued $$2^{1} \sum_{k=1}^{n} IN_k[1] * W_k[0] + \ldots + 2^{3}$$

$$\sum_{k=1}^{n} IN_k[3] * W_k[0] + \ldots + 2^{10} \sum_{k=1}^{n} IN_k[3] * W_k[7]$$

In the operations described above with reference to FIGS. 23 to 25, the case has been described as the example where all the input signals IN1 to INn are "H"; however, the operations are similarly applicable to a case where one or more of the input signals IN1 to INn are "L".

The 4-bit by 8-bit multiply-accumulate operation has been described above; however, multiply-accumulate operation of the larger number of bits than 4-bit by 8-bit can be performed by making the number of the SRAM cells Wn coupled to the local bit lines LBLnm and LBLXnm larger than 8. For example, by coupling 16 SRAM cells Wn to the local bit lines LBLnm and LBLXnm, a 4-bit by 16-bit multiply-accumulate operation can be performed. Furthermore, by coupling 32 SRAM cells Wn to the local bit lines LBLnm and LBLXnm, a 4-bit by 32-bit multiply-accumulate operation can be performed.

Next, an example will be described in which a multiply-accumulate operation is performed using 2's complement in the case of the 4-bit input signal INn and the 8-bit SRAM cell Wn.

FIG. 26 is a flowchart in the case where a 4-bit by 8-bit multiply-accumulate operation is performed using the 2's complement. In this example, a signal ACC accumulated by the accumulator 17 is calculated using the 2's complement. At S18, a signal AS is output from the ADC and bit shifter 16.

Thereafter, at S18A, when the variable i is 7 and the variable h is not 3, or when the variable i is not 7 and the variable h is 3 (Yes), the processing shifts to S19A. At S19A, the signal AS is shifted left by (h+i) bits by the ADC and bit shifter 16, and the left-shifted digital value is output as a signal BS. The accumulator 17 subtracts, from the signal ACC stored therein, the signal BS, and calculates an accumulated signal ACC.

At S18A, when neither of the condition that the variable i is 7 and the variable h is not 3, nor the condition that the variable i is not 7 and the variable h is 3 is satisfied, the processing shifts to S19B. At S19B, the signal AS is shifted left by (h+i) bits by the ADC and bit shifter 16, and the left-shifted digital value is output as a signal BS. The accumulator 17 adds, to the signal ACC stored therein, the signal BS, and calculates an accumulated signal ACC.

After the processing at S19A or S19B ends, the processing shifts to S20. The other operations are similar to those in FIG. 24. As shown in FIG. 26, through the utilization of the 2's complement, arithmetic using positive and negative numbers can be performed.

1.3 Advantageous Effects of Embodiment

In the present embodiment, it is possible to provide the arithmetic device capable of improving the arithmetic precision.

Hereinafter, advantageous effects of the arithmetic device according to the embodiment will be discussed in detail.

The arithmetic device according to the embodiment includes a multi-tiered bit line structure (or a hierarchical bit line structure) including: a first bit line (e.g., a local bit line LBLX11) electrically coupled to a first memory cell (e.g., an SRAM cell W1[0]); a second bit line (e.g., a local bit line LBLX21) electrically coupled to a second memory cell (e.g., an SRAM cell W2[0]); and a third bit line (e.g., a global bit line GBLX1) electrically coupled to the first and second bit lines via respective switching circuits (e.g., switching circuits SX1 and SX2).

Data stored in the first memory cell is read into the first bit line, and data stored in the second memory cell is read into the second bit line. After data is read into the first bit line and the second bit line, the switching circuit is brought to the coupled state, and the first bit line and the third bit line, and the second bit line and the third bit line are respectively brought into conduction. Thereby, the charge of the first bit line, the second bit line, and the third bit line is shared among the first bit line, the second bit line, and the third bit line by charge sharing. This causes the voltages of the first bit line, the second bit line, and the third bit line to transition to a first voltage. The first voltage of the third bit line is converted into a digital signal AS by analog-to-digital conversion. A plurality of signals AS obtained by the above operation are accumulated, and an accumulated signal ACC is output.

Also, data stored in a third memory cell (e.g., an SRAM cell W1[1]) and a fourth memory cell (e.g., an SRAM cell W2[1]), for example, is given a weight (e.g., a weight WE2). Thus, when data is read from the third and fourth memory cells to the third bit line via the first and second bit lines, the first voltage of the third bit line is converted into a signal AS, and the signal AS is subjected to a bit shift (e.g., a 1-bit left shift) according to a weight given to the third and fourth memory cells. The bit-shifted signal AS is output as a signal BS. A plurality of signals BS obtained by the above operation are accumulated, and an accumulated signal ACC is output.

According to the embodiment, it is possible to improve the arithmetic precision in the arithmetic device. The reasons for this will be described below.

In the embodiment, since charge sharing is used in reading data from the first bit line and the second bit line to the third bit line, an amplitude of the first voltage generated in the third bit line depends on the capacitances of the first bit line, the second bit line, and the third bit line. Thus, the amount of transition of the first voltage which transitions according to the data in the first and second memory cells becomes stable, and the precision of the signal AS calculated by converting the first voltage is improved. Furthermore, the arithmetic precision of the signal ACC calculated by accumulating the signal AS is improved.

According to the embodiment, it is possible to reduce a read disturb that occurs during a read operation. The reasons for this will be described below.

In the embodiment, after data is read into the first bit line and the second bit line from the first memory cell and the second memory cell, the first memory cell and the first bit line, and the second memory cell and the second bit line are respectively set so as to be interrupted from each other. After that, data is read from the first and second bit lines to the third bit line.

That is, the transfer transistor between the first memory cell and the first bit line is set to an on state, causing the voltage of the first bit line to transition according to data stored in the first memory cell. At the same time, the transfer transistor between the second memory cell and the second bit line is set to the on state, causing the voltage of the second bit line to transition according to data stored in the second memory cell. Subsequently, the two transfer transistors are set to the off state, and then a switching circuit between the first and second bit lines and the third bit line is set to the coupled state. This allows the charge to be shared between the first and second bit lines and the third bit line through charge sharing, causing the voltages of the first bit line, the second bit line, and the third bit line to transition to a first voltage.

In the above-described read operation, the two transfer transistors are set to the off state, and then switching circuits between the first and second bit lines and the third bit line are set to the coupled state. Thus, when the charge is shared between the first and second bit lines and the third bit line, it is possible to prevent the effects on the memory cells such as the charge flowing into the first or second memory cell. It is thereby possible to reduce the concern that the read disturb may occur during the read operation.

2. Others

The "couple" described in the embodiments can also be expressed as "connect".

The embodiments described above are presented merely as examples and are not intended to restrict the scope of the invention. These embodiments may be implemented in various other forms, and various omissions, replacements, and changes can be made without departing from the gist of the invention. The embodiments and their modifications are included in the scope and spirit of the invention and are included in the scope of the claimed inventions and their equivalents.

What is claimed is:
1. An arithmetic device comprising:
a first memory cell including a first inverter and a second inverter;
a first bit line electrically coupled to the first memory cell;
a first transistor electrically coupled between the first memory cell and the first bit line;
a second memory cell including a third inverter and a fourth inverter;
a second bit line electrically coupled to the second memory cell, the second bit line differing from the first bit line;
a second transistor electrically coupled between the second memory cell and the second bit line;
a third bit line which differs from both the first bit line and the second bit line;
a first switching circuit electrically coupled between the first bit line and the third bit line, the first switching circuit being configured to switch between the first bit line and the third bit line to either a coupled state or a decoupled state;
a second switching circuit electrically coupled between the second bit line and the third bit line, the second switching circuit being configured to switch between the second bit line and the third bit line to either a coupled state or a decoupled state; and
a controller configured to control the first transistor, the second transistor, the first switching circuit, and the second switching circuit,
wherein the controller is configured to:
set a conduction state between the first memory cell and the first bit line by the first transistor;
set a conduction state between the second memory cell and the second bit line by the second transistor;
set the first switching circuit and the second switching circuit in a coupled state;
set the conduction state between the first bit line and the third bit line and between the second bit line and the third bit line to transition voltages of the first bit line, the second bit line, and the third bit line to a first voltage;
convert the first voltage of the third bit line into a first value of a digital value;
calculate a second value by maintaining the first value or subjecting the first value to a bit shift according to weights given to data in the first and second memory cells; and
output an accumulated value obtained by accumulating the second value.

2. The arithmetic device according to claim 1, further comprising:
a first word line electrically coupled to a gate of the first transistor;
a second word line electrically coupled to a gate of the second transistor;
a first driver electrically coupled to the first and second word lines;
a third word line electrically coupled to a control terminal of the first switching circuit;
a fourth word line electrically coupled to a control terminal of the second switching circuit; and
a second driver electrically coupled to the third word line and the fourth word line, wherein
the first driver is configured to assert a first signal to be supplied to the first and second word lines, and then negate the first signal, and
the second driver is configured to assert a second signal to be supplied to the third word line after the first signal is negated by the first driver.

3. The arithmetic device according to claim 1, further comprising:
an analog-to-digital conversion circuit configured to convert the first voltage of the third bit line into the first value; and
a bit shifter configured to subject the first value obtained by the analog-to-digital conversion circuit to a bit shift.

4. The arithmetic device according to claim 3, further comprising:
an accumulator configured to accumulate the first value output from the analog-to-digital conversion circuit or the bit shifted first value from the bit shifter.

5. The arithmetic device according to claim 3, further comprising:
a third memory cell including a fifth inverter and a sixth inverter;
a third transistor electrically coupled between the third memory cell and the first bit line;
a fourth memory cell including a seventh inverter and an eighth inverter; and
a fourth transistor electrically coupled between the fourth memory cell and the second bit line, wherein
the controller is further configured to:
set a conduction state between the third memory cell and the first bit line by the third transistor;
set a conduction state between the fourth memory cell and the second bit line by the fourth transistor;
set the first switching circuit and the second switching circuit in the coupled state; and
set the conduction state between the first bit line and the third bit line and between the second bit line and the third bit line to transition the voltages of the first bit line, the second bit line, and the third bit line to a second voltage, the analog-to-digital conversion circuit is configured to convert the second voltage of the third bit line into a second value, and
the bit shifter is configured to subject the second value obtained by the analog-to-digital conversion circuit to a bit shift.

6. The arithmetic device according to claim 5, wherein:
data stored in the first and second memory cells is given a first weight, and
data stored in the third and fourth memory cells is given a second weight different from the first weight, respectively.

7. The arithmetic device according to claim 6, wherein:
the second weight is $2^n$ times the first weight, where n is a natural number equal to or greater than one.

8. The arithmetic device according to claim 1, further comprising:
a precharge circuit electrically coupled to the first and second bit lines, the precharge circuit being configured to charge the first and second bit lines to a third voltage.

9. The arithmetic device according to claim 1, further comprising:
a precharge circuit electrically coupled to the third bit line, the precharge circuit being configured to charge the third bit line to a third voltage.

10. The arithmetic device according to claim 1, wherein:
an output terminal of the first inverter is electrically coupled to an input terminal of the second inverter, and an output terminal of the second inverter is electrically coupled to an input terminal of the first inverter in the first memory cell, and
an output terminal of the third inverter is electrically coupled to an input terminal of the fourth inverter, and an output terminal of the fourth inverter is electrically coupled to an input terminal of the third inverter in the second memory cell.

11. An arithmetic method for an arithmetic device including a first memory cell of a static random access memory (SRAM) and a second memory cell of the SRAM, the arithmetic method comprising:
reading data stored in the first memory cell into a first bit line;
reading data stored in the second memory cell into a second bit line, the second bit line differing from the first bit line;
setting a conduction state between the first bit line and a third bit line and a conduction state between the second bit line and the third bit line after reading data into the first bit line and the second bit line, the third bit line differing from the first bit line and the second bit line;
transitioning a voltage of the third bit line to a first voltage by sharing charges of the first bit line, the second bit line, and the third bit line;
converting the first voltage of the third bit line into a first value of a digital value;
calculating a second value by maintaining the first value or subjecting the first value to a bit shift according to weights given to the data in the first and second memory cells; and
outputting an accumulated value obtained by accumulating the second value.

12. The arithmetic method according to claim 11, further comprising:
setting a conduction state between the first memory cell and the first bit line by a first transistor;
setting a conduction state between the second memory cell and the second bit line by a second transistor;

after setting both to the conduction state, setting a non-conduction state between the first memory cell and the first bit line by the first transistor and setting a non-conduction state between the second memory cell and the second bit line by the second transistor; and after setting both to the non-conduction state, setting the conduction state between the first bit line and the third bit line by a first switching circuit and setting the conduction state between the second bit line and the third bit line by a second switching circuit.

13. The arithmetic method according to claim 11, further comprising:

converting by an analog-to-digital conversion circuit, the first voltage of the third bit line into the first value; and subjecting by a bit shifter, the first value converted by the analog-to-digital conversion circuit to a bit shift.

14. The arithmetic method according to claim 13, further comprising:

accumulating by an accumulator, the first value output from the analog-to-digital conversion circuit or the bit shifted first value from the bit shifter.

15. The arithmetic method according to claim 12, the arithmetic device further comprising a third memory cell of an SRAM and a fourth memory cell of an SRAM, the arithmetic method further comprising:

setting a conduction state between the third memory cell and the first bit line by a third transistor, and setting a conduction state between the fourth memory cell and the second bit line by a fourth transistor;

after setting both to the conduction state, setting a non-conduction state between the third memory cell and the first bit line by the third transistor and setting a non-conduction state between the fourth memory cell and the second bit line by the fourth transistor; and after setting both to the non-conduction state, setting the conduction state between the first bit line and the third bit line by the first switching circuit and setting the conduction state between the second bit line and the third bit line by the second switching circuit, and thereby voltages of the first bit line, the second bit line, and the third bit line transition to a second voltage.

16. The arithmetic method according to claim 15, wherein:

data stored in the first and second memory cells is given a first weight, and data stored in the third and fourth memory cells is given a second weight different from the first weight, respectively.

17. The arithmetic method according to claim 16, wherein:

the second weight is $2^n$ times the first weight, where n is a natural number equal to or greater than one.

18. The arithmetic method according to claim 11, further comprising:

charging by a precharge circuit, the first and second bit lines to a third voltage.

19. The arithmetic method according to claim 11, further comprising:

charging by a precharge circuit, the third bit line to a third voltage.

20. The arithmetic method according to claim 11, wherein:

the first memory cell includes a first inverter and a second inverter, the second memory cell includes a third inverter and a fourth inverter;

an output terminal of the first inverter and an input terminal of the second inverter are coupled, and an input terminal of the first inverter and an output terminal of the second inverter are coupled; and an output terminal of the third inverter and an input terminal of the fourth inverter are coupled, and an input terminal of the third inverter and an output terminal of the fourth inverter are coupled.

* * * * *